United States Patent
Toyoda

(10) Patent No.: US 11,164,797 B2
(45) Date of Patent: Nov. 2, 2021

(54) METHOD OF MANUFACTURING SEMICONDUCTOR INTEGRATED CIRCUIT

(71) Applicant: FUJI ELECTRIC CO., LTD., Kawasaki (JP)

(72) Inventor: Yoshiaki Toyoda, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 126 days.

(21) Appl. No.: 16/214,844

(22) Filed: Dec. 10, 2018

(65) Prior Publication Data

US 2019/0252269 A1  Aug. 15, 2019

(30) Foreign Application Priority Data

Feb. 15, 2018 (JP) .............................. JP2018-025504

(51) Int. Cl.
*H01L 29/66* (2006.01)
*H01L 27/06* (2006.01)
(Continued)

(52) U.S. Cl.
CPC .... *H01L 21/823878* (2013.01); *H01L 21/266* (2013.01); *H01L 21/2652* (2013.01); *H01L 21/3086* (2013.01); *H01L 21/324* (2013.01); *H01L 21/823892* (2013.01); *H01L 27/0623* (2013.01); *H01L 29/0865* (2013.01); *H01L 29/0882* (2013.01); *H01L 29/1095* (2013.01); *H01L 29/41741* (2013.01);
(Continued)

(58) Field of Classification Search
CPC ............. H01L 29/7397; H01L 29/1095; H01L 29/66348; H01L 29/66734; H01L 29/7813; H01L 29/36; H01L 29/7455; H01L 29/66363; H01L 27/0922; H01L 27/0925; H01L 27/0927; H01L 27/0928; H01L 27/0263; H01L 27/0623; H01L 27/0635; H01L 27/0716; H01L 27/0705; H01L 21/823892
See application file for complete search history.

(56) References Cited

U.S. PATENT DOCUMENTS

| | | | | |
|---|---|---|---|---|
| 6,262,453 B1 * | 7/2001 | Hshieh | ................ | H01L 29/0878 257/341 |
| 6,312,981 B1 * | 11/2001 | Akamatsu | ........... | H01L 21/2652 438/217 |
| 7,242,059 B2 * | 7/2007 | Negoro | ........... | H01L 21/823892 257/338 |
| 7,544,558 B2 * | 6/2009 | Ren | ................. | H01L 21/823412 257/E21.418 |

(Continued)

FOREIGN PATENT DOCUMENTS

JP  49-24676 A  3/1974
JP  53-10282 A  1/1978
(Continued)

*Primary Examiner* — Michael M Trinh

(57) ABSTRACT

A method of manufacturing a semiconductor integrated circuit, includes: forming a first well region having a second conductivity type in an upper portion of a support layer having a first conductivity type; forming an oxide film on the first well region by a thermal oxidation method to decrease a concentration of impurities at an top surface of top surface side of the first well region; removing the oxide film; forming a second well region having the first conductivity type in an upper portion of the first well region; and merging a semiconductor element having a main electrode region having the second conductivity type in the second well region.

20 Claims, 22 Drawing Sheets

(51) Int. Cl.
*H01L 21/8238* (2006.01)
*H01L 21/324* (2006.01)
*H01L 21/265* (2006.01)
*H01L 21/266* (2006.01)
*H01L 21/308* (2006.01)
*H01L 29/423* (2006.01)
*H01L 29/417* (2006.01)
*H01L 29/10* (2006.01)
*H01L 29/78* (2006.01)
*H01L 29/08* (2006.01)
*H01L 29/739* (2006.01)
*H01L 29/745* (2006.01)

(52) U.S. Cl.
CPC .. *H01L 29/42368* (2013.01); *H01L 29/42376* (2013.01); *H01L 29/66348* (2013.01); *H01L 29/66734* (2013.01); *H01L 29/7813* (2013.01); *H01L 29/66363* (2013.01); *H01L 29/7397* (2013.01); *H01L 29/7455* (2013.01)

(56) References Cited

U.S. PATENT DOCUMENTS

| | | | | |
|---|---|---|---|---|
| 8,574,974 | B2* | 11/2013 | Minami | H01L 21/82 438/206 |
| 10,916,624 | B2* | 2/2021 | Toyoda | H01L 27/0922 |
| 2009/0302382 | A1* | 12/2009 | Adan | H01L 29/4236 257/334 |
| 2013/0214351 | A1* | 8/2013 | Izumi | H01L 21/823456 257/334 |
| 2014/0073102 | A1* | 3/2014 | Toyoda | H01L 27/0922 438/270 |
| 2017/0092759 | A1* | 3/2017 | Okuda | H01L 29/7813 |

FOREIGN PATENT DOCUMENTS

| | | |
|---|---|---|
| JP | 59-31230 B2 | 7/1984 |
| JP | 6-21072 A | 1/1994 |
| JP | 2006-253334 A | 9/2006 |
| JP | 5515821 A | 6/2014 |

\* cited by examiner

FIG. 1

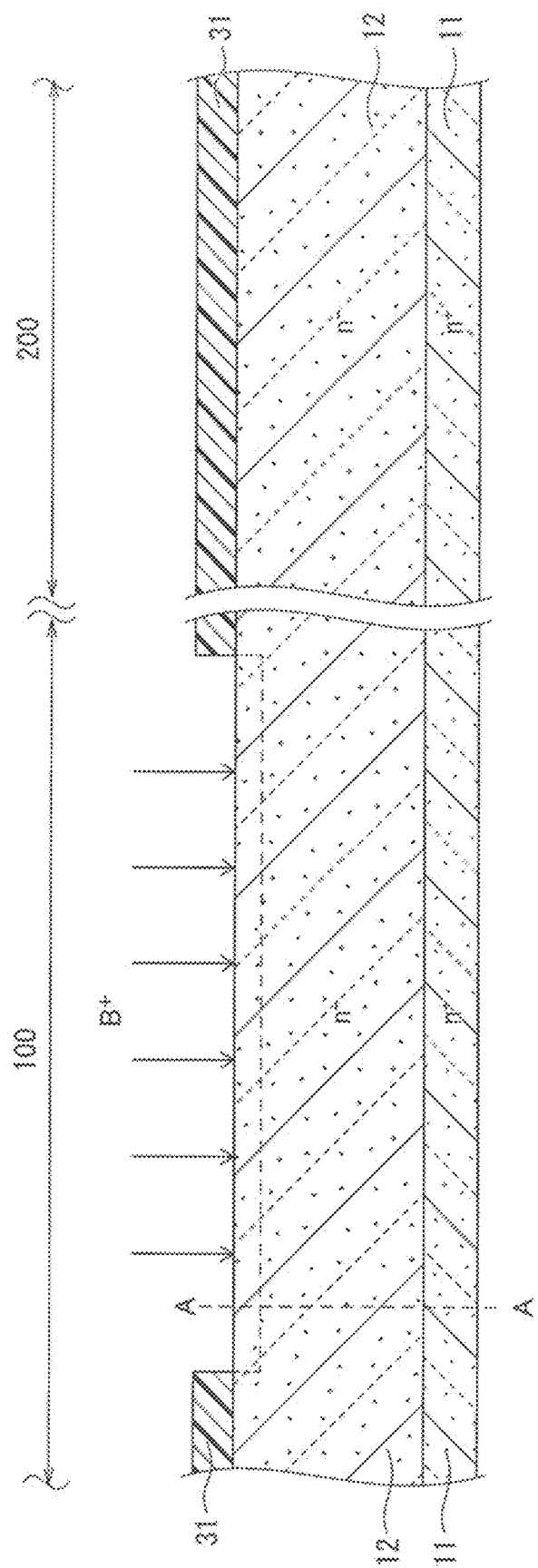

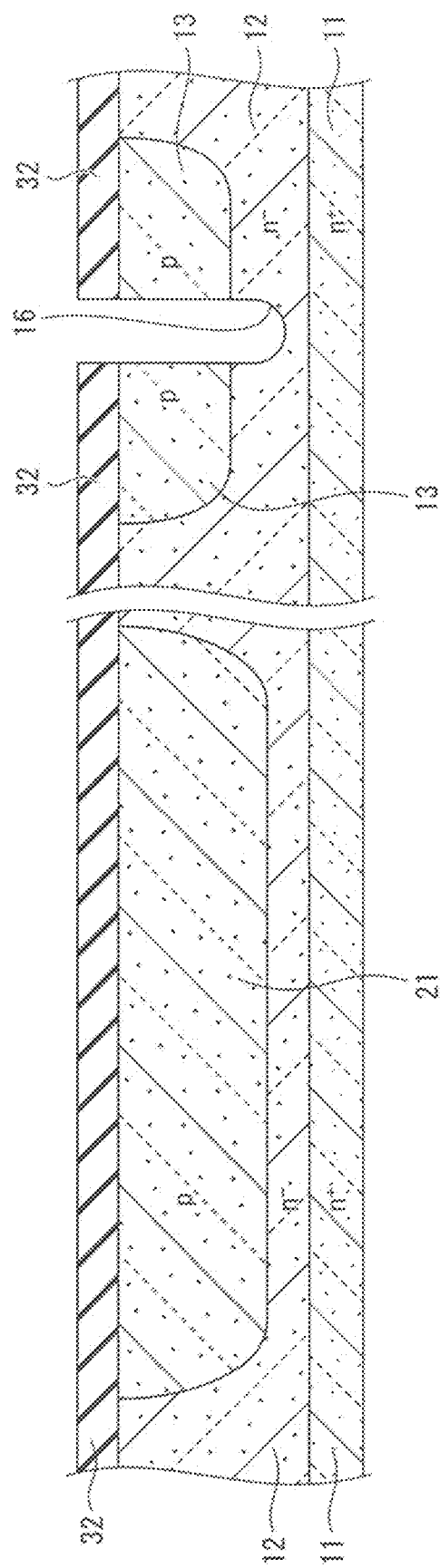

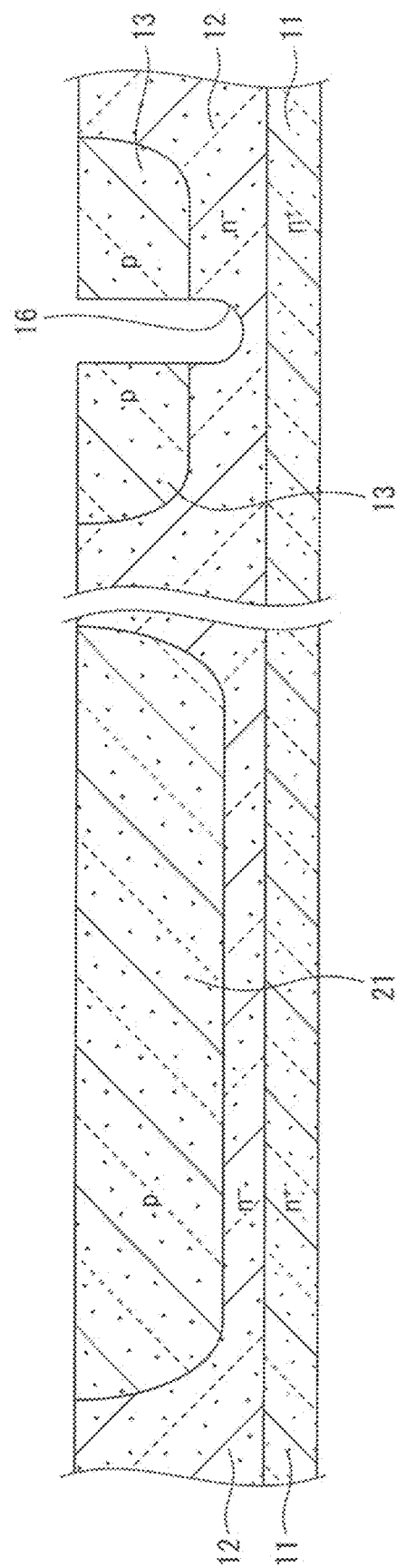

METHOD OF MANUFACTURING SEMICONDUCTOR INTEGRATED CIRCUIT

CROSS-REFERENCE TO RELATED APPLICATION

This application claims benefit of priority under 35 USC 119 based on Japanese Patent Application No. 2018-025504 filed on Feb. 15, 2018, the entire contents of which are incorporated by reference herein.

BACKGROUND OF THE INVENTION

1. Field of the Invention

The present invention relates to a method of manufacturing a semiconductor integrated circuit, and more particularly, to a method of manufacturing a semiconductor integrated circuit (power IC) for electric power.

2. Description of the Related Art

As a structural example of a high-side power IC for in-vehicle use or the like, a monolithic integrated circuit (IC) structure in which a n-channel vertical MOSFET for an output stage and a lateral MOSFET for a control circuit are built on the same n-type substrate has been known. The bottom surface side of an n-type substrate is a drain terminal of the vertical MOSFET and is connected to a power supply voltage terminal (VCC terminal) to which a battery is connected. When the n-type substrate is fixed to the power supply voltage, in order to form a p-channel lateral MOSFET for a circuit usable at a floating potential, it is necessary to form a triplet diffusion structure (multi-junction structure) including a p-type well region, an n-type well region, and a $p^+$-type region in an upper portion of an n-type substrate.

In the case of in-vehicle use or the like, the VCC terminal of the high-side power IC generally requires a breakdown-voltage of about 50 volts to 60 volts or more. In a case where a high voltage is applied across the n-type substrate and the p-type well region, it is necessary to prevent occurrence of punch-through in an n-p-n multi-junction structure including an n-type substrate, a p-type well region and an n-type well region. In addition, in a case where the p-channel lateral MOSFET is used in a circuit, a voltage of about 10 volts to 30 volts is applied across the n-type well region and the p-type well region. For this reason, it is also necessary to prevent occurrence of punch-through in a p-n-p multi-junction structure including a $p^+$-type region, an n-type well region, and a p-type well region.

However, in a case where the p-type well region and the n-type well region are formed by a general ion implantation process and a thermal diffusion process, respectively, a punch-through voltage of the n-p-n multi-junction structure and a punch-through voltage of the p-n-p multi-junction structure is in a trade-off relationship with each other, and thus, there is a problem that it is difficult to secure a margin of breakdown-voltage characteristic against the required design-specification when the process varies.

JP 49-24676 A discloses that, after a diffused layer is formed in a semiconductor substrate, a thermal oxide film is formed on the diffused layer, so that surplus impurities in the vicinity of a surface of a semiconductor substrate are absorbed and extracted. JP 53-10282 A discloses that a thermal oxide film is grown in a region into which p-type impurity ions and n-type impurity ions are doubly implanted, and absorption and extraction of p-type impurities into the oxide film and accumulation of n-type impurities on a silicon surface are performed to form an n-type region in the vicinity of a surface of a substrate. JP 2006-253334 A discloses that, after a field insulating film is formed, ion implantation for forming a low concentration drain region is performed, so that impurities are prevented from being absorbed and extracted due to the formation of the field insulating film. JP 6-21072 A discloses that a silicide film is formed on a surface of a base region of a bipolar transistor, and thus, a surface impurity concentration of the base region is decreased by a boron (B) absorption/extraction effect. JP 5515821 B2 discloses that, after a gate oxide film is formed by thermal oxidation at a first processing temperature, phosphorus (P) which have been piled up during the formation process of the gate oxide film and boron (B) which have been absorbed and extracted are redistributed by annealing at a second processing temperature higher than the first processing temperature. In these back ground arts recited in the above five patent literatures, the above-mentioned problems are not taken into consideration.

In view of the above-mentioned problems, an object of the invention is to provide a method of manufacturing a semiconductor integrated circuit including a plurality of multi-junction structures having opposite conductivity types, capable of improving punch-through voltages of the multi-junction structures having opposite conductivity types, which are in a trade-off relationship, and easily securing a margin of a breakdown-voltage characteristic against process variation.

SUMMARY OF THE INVENTION

An aspect of the present invention inheres in a method of manufacturing a semiconductor integrated circuit, encompassing: preparing a support layer having a first conductivity type; forming a first well region having a second conductivity type in an upper portion of the support layer; forming an oxide film on the first well region by a thermal oxidation method to decrease a concentration of impurities at an top surface of the first well region, the impurities having the second conductivity type; removing the oxide film; forming a second well region having the first conductivity type in an upper portion of the first well region; and merging a semiconductor element having a main-electrode region having the second conductivity type in the second well region.

Another aspect of the present invention inheres in a method of manufacturing a semiconductor integrated circuit encompassing: preparing a support layer having a first conductivity type; forming a first well region having a second conductivity type in an upper portion of the support layer; forming a second well region having the first conductivity type in an upper portion of the first well region; forming an oxide film on the second well region by a thermal oxidation method to decrease a concentration of impurities at the top surface of the second well region, the impurities having the second conductivity type; removing the oxide film; and merging a semiconductor element having a main-electrode region having the second conductivity type in the second well region.

BRIEF DESCRIPTION OF THE DRAWINGS

FIG. 1 is a cross-sectional view of main components illustrating an example of a semiconductor integrated circuit according to an embodiment of the present invention;

FIG. 5A is a process cross-sectional view illustrating an example of a method of manufacturing a semiconductor integrated circuit according to the embodiment of the present invention;

FIG. 9 is a process cross-sectional view continued from FIG. 8 illustrating the example of the method of manufacturing the semiconductor integrated circuit according to the embodiment of the present invention;

FIG. 10 is a process cross-sectional view continued from FIG. 9 illustrating the example of the method of manufacturing the semiconductor integrated circuit according to the embodiment of the present invention;

DETAILED DESCRIPTION OF THE INVENTION

Figure 2:
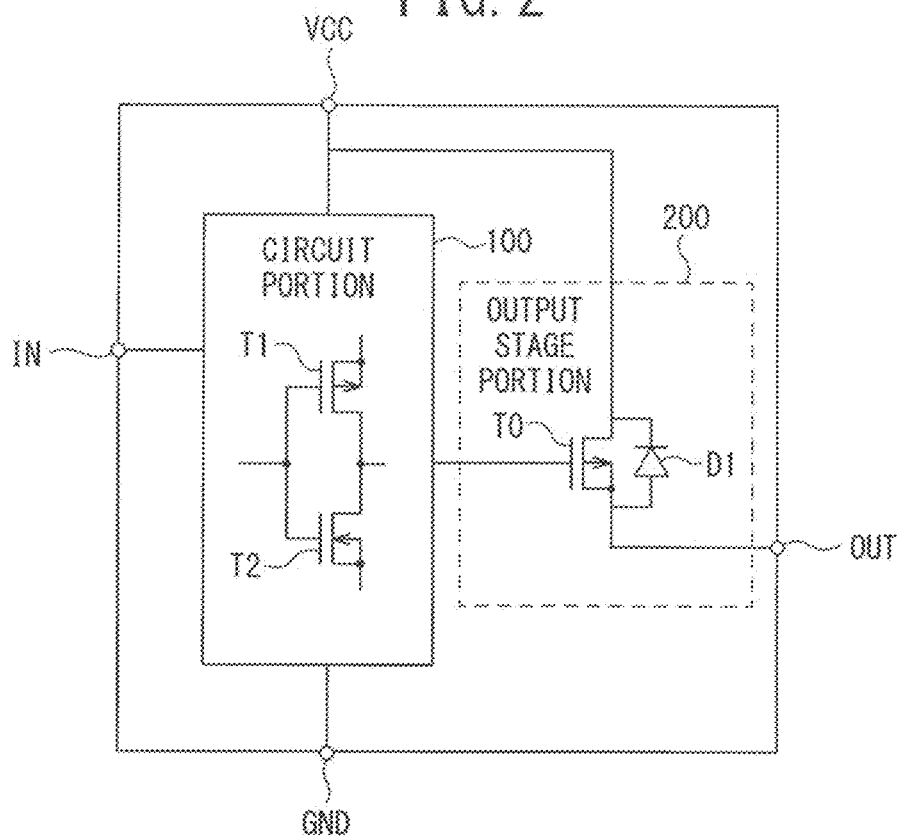
FIG. 2 is an equivalent circuit diagram illustrating the example of the semiconductor integrated circuit according to the embodiment of the present invention.

With reference to the drawings, an embodiments of the present invention will be explained in detail below. In the following description of the drawings, the same or similar reference numerals are assigned to the same or similar portions. The drawings are schematic, and it should be noted that the relationship between thickness and planer dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

In the embodiment of the present invention, various semiconductor elements are monolithically integrated in a semiconductor integrated circuit. In the embodiment of the present invention, a "first main-electrode region" of the integrated semiconductor element is assigned to a source region or a drain region in a field-effect transistor (FET) or a static induction transistor (SIT), an emitter region or a collector region in an insulated-gate bipolar transistor (IGBT) and an anode region or a cathode region in a static induction (SI) thyristor or a gate turn-off (GTO) thyristor. A "second main-electrode region" of the integrated semiconductor element is assigned to a semiconductor region which is not assigned as the first main-electrode region and will be the source region or the drain region in the FET or the SIT, the emitter region or the collector region in the IGBT, and the anode region or the cathode region in the SI thyristor or the GTO thyristor. That is, when the first main-electrode region of the integrated semiconductor element is the source region, the second main-electrode region of the integrated semiconductor element means the drain region. When the first main-electrode region is the emitter region, the second main-electrode region means the collector region. When the first main-electrode region is the anode region, the second main-electrode region means the cathode region. In some appropriate cases, a function of the first main-electrode region and a function of the second main-electrode region are exchangeable each other by exchanging a bias relationship if the structure of the subject semiconductor device is symmetric such as MISFET. Furthermore, a "main-electrode region" is described in the Specification, the main-electrode region comprehensively means any one of the first main-electrode region and the second main-electrode region.

Furthermore, a "third main-electrode region" of the integrated semiconductor element is assigned to a source region or a drain region in the FET or the SIT, an emitter region or a collector region in the IGBT and an anode region or a cathode region in the SI thyristor or the GTO thyristor. A "fourth main-electrode region" of the integrated semiconductor element is assigned to a semiconductor region which is not assigned as the third main-electrode region and will be the source region or the drain region in the FET or the SIT, the emitter region or the collector region in the IGBT, and the anode region or the cathode region in the SI thyristor or the GTO thyristor.

That is, when the first or third main-electrode region of the integrated semiconductor element is the source region, the second or fourth main-electrode region of the integrated semiconductor element means the drain region. When the first or third main-electrode region is the emitter region, the second or fourth main-electrode region means the collector region. When the first or third main-electrode region is the anode region, the second or fourth main-electrode region means the cathode region. In some appropriate cases, a function of the first or third main-electrode region and a function of the second or fourth main-electrode region are exchangeable each other by exchanging a bias relationship if the structure of the subject semiconductor device is symmetric such as metal-insulator-semiconductor (MIS) FET. Furthermore, a "main-electrode region" is described in the Specification, the main-electrode region comprehensively means any one of the first or third main-electrode region and the second or fourth main-electrode region.

Further, definitions of directions such as an up-and down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

Further, in the following description, there is exemplified a case where a first conductivity type is an n type and a second conductivity type is a p type. However, the relationship of the conductivity types may be inverted to set the first conductivity type to the p type and the second conductivity type to the n type. Further, a semiconductor region denoted by the symbol "n" or "p" attached with "+" indicates that such semiconductor region has a relatively high impurity concentration as compared to a semiconductor region denoted by the symbol "n" or "p" without "+". A semiconductor region denoted by the symbol "n" or "p" attached with "−" indicates that such semiconductor region has a relatively low impurity concentration as compared to a semiconductor region denoted by the symbol "n" or "p" without "−". However, even when the semiconductor regions are denoted by the same reference symbols "n" and "n", it is not indicated that the semiconductor regions have exactly the same impurity concentration.

<Semiconductor Integrated Circuit>

Figure 1:
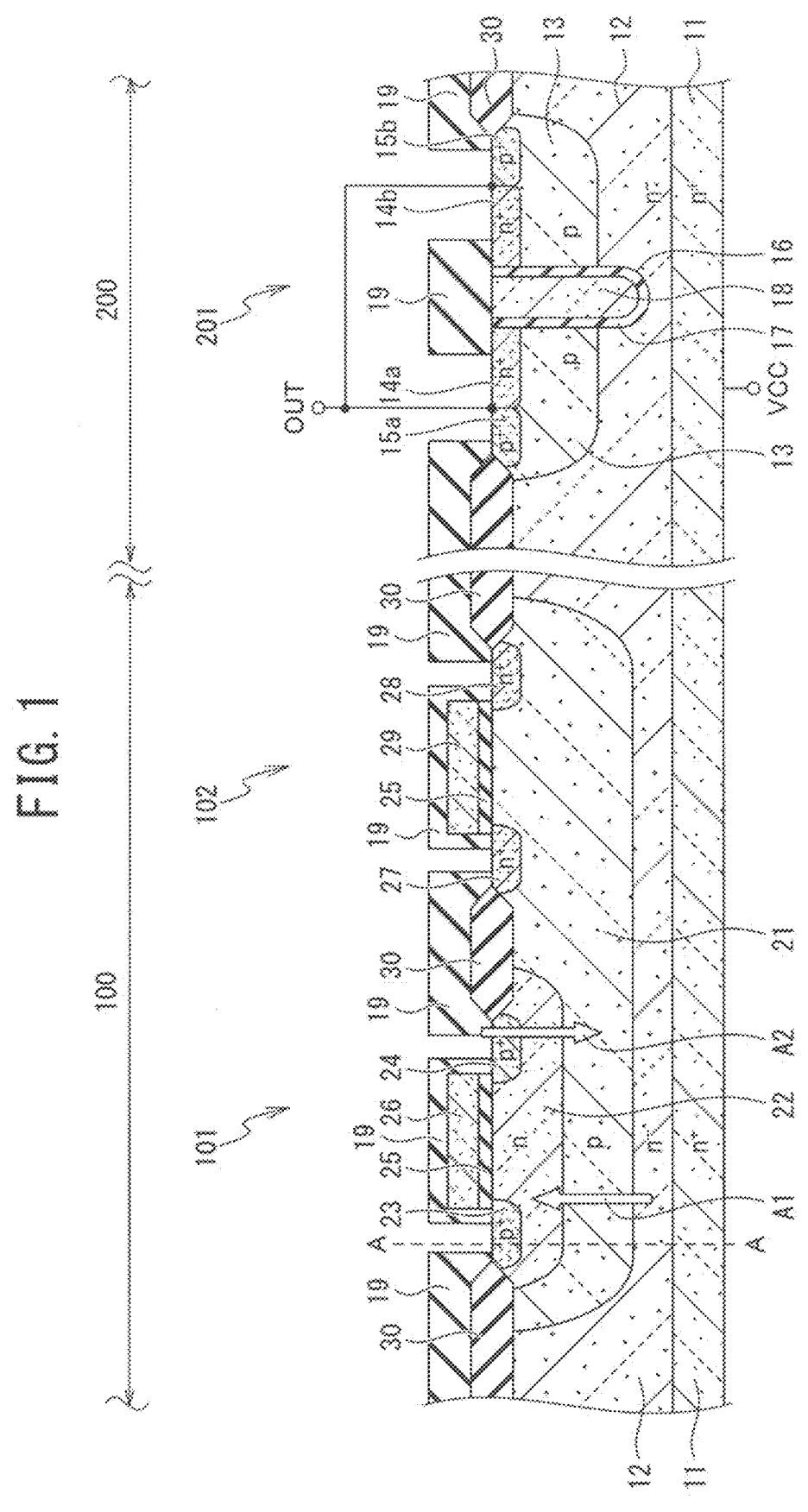

A high-side power IC, which is preferable for a design-specification of in-vehicle use, will be described as an example of a semiconductor integrated circuit according to an embodiment of the present invention. As illustrated in FIG. 1, the semiconductor integrated circuit according to an embodiment of the present invention is a monolithic power IC including an output stage portion 200 having a power semiconductor element and a circuit portion 100 having semiconductor elements for a control circuit, circuit elements, protective elements, and the like, which are merged in the same semiconductor chip. In FIG. 1, a structure where a vertical power semiconductor element for an output stage is integrated in the output stage portion 200 is illustrated.

In the following description, a case such that a semiconductor base body (11, 12) is made by a base material of semiconductor silicon (Si), and the semiconductor base body implements a semiconductor chip will be explained. But the following description is merely an example, and the base material is not limited to Si. In addition, in FIG. 1, a structure of the semiconductor base body (11, 12) including a bottom contact layer 11, which has a first conductivity type ($n^+$-type) and made of a semiconductor substrate (Si wafer) having a high impurity concentration, and a support layer 12 of the first conductivity type ($n^−$-type) epitaxially grown on the bottom contact layer 11, the support layer 12 has an impurity concentration lower than that of the bottom contact layer 11 will be exemplified. However, the semiconductor base body (11, 12) may include the support layer 12 of an $n^−$-type semiconductor substrate—an $n^−$-type Si wafer—, and the bottom contact layer 11 made of an $n^+$-type diffused layer in the bottom portion of the support layer 12, the $n^+$-type diffused layer is doped through the bottom surface of the support layer 12 by ion implantation method or thermal diffusion method.

In a case where the semiconductor substrate is assigned as the bottom contact layer 11, the impurity concentration of the bottom contact layer 11, for example, about $2 \times 10^{18}$ cm$^{-3}$ to $1 \times 10^{19}$ cm$^{-3}$ can be easily obtained on the market. In this case, the impurity concentration of the support layer 12 can be selected to be, for example, about $1 \times 10^{14}$ cm$^{-3}$ to $1 \times 10^{16}$ cm$^{-3}$, herein, for example, about $1 \times 10^{15}$ cm$^{-3}$ to $1 \times 10^{16}$ cm$^{-3}$. In a case where the bottom contact layer 11 is assigned as the $n^+$-type diffused layer formed in the bottom portion of the support layer 12 made of an $n^−$-type semiconductor substrate, the impurity concentration of the bottom contact layer 11 can be about $5 \times 10^{18}$ cm$^{-3}$ to $1 \times 10^{21}$ cm$^{-3}$. In addition, the impurity concentration of the bottom contact layer 11 may not be constant, and may have a graded doping profile such that the impurity concentration gradually increases to about $1 \times 10^{21}$ cm$^{-3}$ toward the interface with a bottom electrode (not illustrated), the bottom electrode is connected to the bottom contact layer 11. In addition, a composite structure of an upper layer of about $5 \times 10^{18}$ cm$^{-3}$ to $2 \times 10^{19}$ cm$^{-3}$ on the support layer 12 side and a lower layer of about $3 \times 10^{19}$ cm$^{-3}$ to $1 \times 10^{21}$ cm$^{-3}$ on the bottom electrode side may be used, for example.

In the output stage portion 200 illustrated on the right side of FIG. 1, an n-channel trench gate vertical MOSFET (hereinafter, referred to as a "vertical element") 201 is provided as a power semiconductor element. In the vertical element 201, the bottom contact layer 11 is assigned as a bottom main-electrode region (drain region), and the support layer 12 is assigned as a drift layer. On the bottom surface side of the bottom contact layer 11, a bottom electrode (not illustrated) to be a drain electrode is arranged, and the bottom surface of the bottom contact layer 11 is connected to a power supply voltage terminal VCC.

As illustrated in FIG. 1, a field oxide film 30 is selectively provided on the top surface of the support layer 12 so as to define an active area in the output stage portion 200. Namely, the active area of the output stage portion 200 is defined in a window portion of the peripheral field oxide film 30. And, in the active area, a base region (body region) having a second conductivity type (p-type) is provided as a well region 13, which is buried in an upper portion of the support layer 12. A couple of $n^+$-type top main-electrode regions (source regions) 14a and 14b having an impurity concentration higher than that of the support layer 12 are selectively provided in an upper portion of the well region 13. In addition, $p^+$-type base contact regions 15a and 15b are selectively provided in an upper portion of the well region 13 so as to be in contact with the source regions 14a and 14b, respectively. A source electrode interconnection (not illustrated) is arranged on the base contact regions 15a and 15b and the source regions 14a and 14b. And the base contact regions 15a and 15b and the source regions 14a and 14b are connected to an output terminal OUT by the source electrode interconnection.

A trench 16 penetrating the source regions 14a and 14b and the well region 13 from the top surface of the support layer 12 is provided. A vertical control-electrode structure (17, 18) encompasses a gate insulating film 17 covering the inner surface of the trench 16 and a gate electrode (trench gate electrode) 18 buried in the trench 16 through the gate insulating film 17. The gate electrode 18 electrostatically controls the surface potential of the well region 13 at the side-surface side of the trench through the gate insulating film 17, so that an inverted channel is formed in the surface of well region 13 serving as a base region (body region) at the side-surface side of the trench. On the cross section of FIG. 1, a structure of an interlayer insulating film 19 made of a borophosphosilicate glass (BPSG) film or the like, the BPSG film is a silicon oxide film containing phosphorus and boron, is laminated on the peripheral field oxide film 30 is exemplified. Furthermore, the interlayer insulating film 19 is laminated so as to cover the vertical control-electrode structure (17, 18) in the active area.

On the other hand, in the circuit portion 100 illustrated on the left side of FIG. 1, a p-channel lateral MOSFET (hereinafter, referred to as a "first lateral element") 101 and a n-channel lateral MOSFET (hereinafter, referred to as a "second lateral element") 102 are provided as semiconductor elements for a control circuit. A complementary MOS (CMOS) is merged as a portion of the control circuit by the first lateral element 101 and the second lateral element 102.

The first lateral element 101 includes a first well region 21 having a second conductivity type (p-type) and being provided in an upper portion of the support layer 12 and a second well region 22 having a first conductivity type (n-type), having an impurity concentration higher than that of the support layer 12, and being provided on inner side and in an upper portion of the first well region 21. The impurity concentration of the first well region 21 is, for example, about $1 \times 10^{16}$ cm$^{-3}$ to $1 \times 10^{17}$ cm$^{-3}$, and the impurity concentration of the second well region 22 is, for example, about $1 \times 10^{16}$ cm$^{-3}$ to $1 \times 10^{17}$ cm$^{-3}$. A first main electrode region (source region) 23 and a second main electrode region (drain region) 24 having the second conductivity type (p$^+$-type) and having an impurity concentration higher than that of the first well region 21 are selectively provided in an upper portion of the second well region 22 to be separated from each other.

That is, the first lateral element 101 is implemented with a p-n-p multi-junction structure as a triple diffused structure of a p-type first well region 21, an n-type second well region 22, and p$^+$-type source region 23 and drain region 24 in an upper portion of the support layer 12. Due to the p-n-p multi-junction structure, the second well region 22, which is a back gate region of the first lateral element 101, is electrically insulated and isolated from the support layer 12 to be used at a floating potential.

A first lateral control-electrode structure (25, 26) is arranged on the second well region 22. The first lateral control-electrode structure (25, 26) includes a gate insulating film 25 provided on the second well region 22 between the source region 23 and the drain region 24 and a first control electrode (gate electrode) 26 arranged on the gate insulating film 25. The gate electrode 26 electrostatically controls the surface potential of the second well region 22 through the gate insulating film 25, so that an inverted channel is formed in the surface layer of the second well region 22.

As the gate insulating film 25, for example, an SiO$_2$ film or the like can be used, but in addition to the SiO$_2$ film, a silicon oxynitride (SiON) film, a strontium oxide (SrO) film, a silicon nitride (Si$_3$N$_4$) film, and an aluminum oxide (Al$_2$O$_3$) film can also be used. Alternatively, a magnesium oxide (MgO) film, an yttrium oxide (Y$_2$O$_3$) film, a hafnium oxide (HfO$_2$) film, a zirconium oxide (ZrO$_2$) film, a tantalum oxide (Ta$_2$O$_5$) film, or a bismuth oxide (Bi$_2$O$_3$) film may be used. In addition, a composite film obtained by selecting some of these single-layer films and stacking a plurality of the films, or the like may be used.

As the material of the gate electrode 26, for example, a polysilicon to which high concentration n-type impurities are heavily doped can be used. However, besides the polysilicon, a refractory metal such as tungsten (W), molybdenum (Mo), titanium (Ti) or a silicide of a refractory metal and a polysilicon can be used. In addition, the material of the gate electrode 26 may be a polycide which is a composite film of a polysilicon and a silicide of a refractory metal. A third main-electrode interconnection (source electrode interconnection) made of a metallic material such as Al is arranged on the source region 23. A fourth main-electrode interconnection (drain electrode interconnection) made of a metallic material such as Al is arranged on the drain region 24.

The second lateral element 102 is provided separately from the first lateral element 101 in an upper portion of the first well region 21. An n$^+$-type first main electrode region (source region) 27 and an n$^+$-type second main electrode region (drain region) 28 having an impurity concentration higher than that of the support layer 12 are selectively provided in an upper portion of the first well region 21 to be separated from each other. A lateral second control electrode structure (25, 29) is arranged on the first well region 21. The second control electrode structure (25, 29) has a gate insulating film 25 provided on the first well region 21 between the source region 27 and the drain region 28 and a second control electrode (gate electrode) 29 arranged on the gate insulating film 25. The gate electrode 29 electrostatically controls the surface potential of the first well region 21 through the gate insulating film 25, so that an inverted channel is formed in the surface layer of the first well region 21. In addition, the field oxide film 30 is selectively provided on the top surface of the support layer 12 on the circuit portion 100 side. The field oxide film 30 continuously covers the top surface of the support layer 12 from the output stage portion 200 side. Then, the interlayer insulating film 19 is laminated on the field oxide film 30, the first lateral control-electrode structure (25, 26) and the second lateral control-electrode structure (25, 29).

FIG. 2 illustrates an equivalent circuit diagram of the semiconductor integrated circuit according to the embodiment of the present invention. In addition, it can be understood from FIG. 2 that the semiconductor integrated circuit according to the embodiment of the present invention includes the circuit portion 100 and the output stage portion 200. The first lateral element 101 and the second lateral element 102 illustrated in FIG. 1 correspond to MOS transistors T1 and T2 included in the circuit portion 100 illustrated in FIG. 2. The MOS transistors T1 and T2 correspond to, for example, a portion of a drive circuit for driving the output stage portion 200. The vertical element 201 illustrated in FIG. 1 corresponds to a MOS transistor T0 of the output stage portion 200 illustrated in FIG. 2. A freewheeling diode D1 is connected to the MOS transistor T0. A source terminal of the MOS transistor T0 is connected to the output terminal OUT, and a drain terminal of the MOS transistor T0 is connected to the power supply voltage terminal VCC.

According to the design-specification for in-vehicle use, it is common that the power supply voltage terminal VCC requires a breakdown-voltage of about 50 volts to 60 volts or more. In the first lateral element 101 illustrated in FIG. 1, in a case where a high voltage is applied across the support layer 12 and the second well region 22, it is necessary to prevent the occurrence of punch-through in the n-p-n multi-junction structure including the n-type support layer 12, the p-type first well region 21, and the n-type second well region 22, the occurrence of the punch-through is indicated by arrow A1 in FIG. 1.

A p-n-p source-side multi-junction structure (first multi-junction structure) is implemented with the p$^+$-type source region 23, the n-type second well region 22, and the p-type first well region 21. Similarly, a p-n-p drain-side multi-junction structure (second multi-junction structure) is implemented with the p$^+$-type drain region 24, the n-type second well region 22, and the p-type first well region 21. When the first lateral element 101 is used in a control circuit with specification for in-vehicle use, a voltage of about 10 V to 30 V is applied between the second well region 22 and the first well region 21. For this reason, it is necessary to prevent occurrence of punch-through (indicated by arrow A2 in the drain-side multi-junction structure in FIG. 1) in each of the source-side multi-junction structure and the drain-side multi-junction structure described above, the occurrence of punch-through is indicated by arrow A2 in the drain-side multi-junction structure in FIG. 1

Comparative Example

Figure 3:
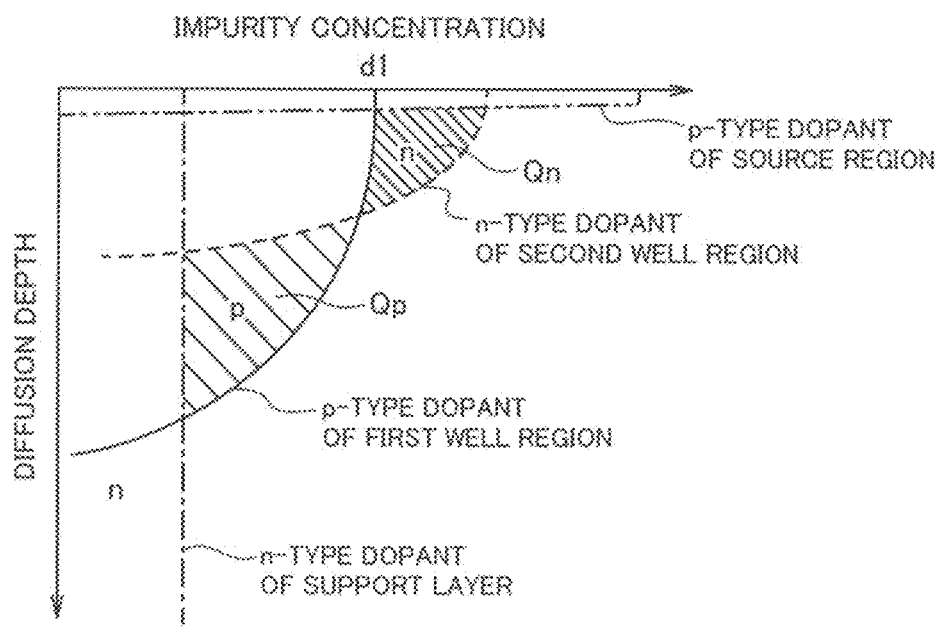
FIG. 3 is a graph showing an impurity concentration distribution in the depth direction from a surface of a semiconductor integrated circuit according to Comparative Example.

F FIG. 3 illustrates an impurity concentration distribution, or the diffusion profile in the depth direction of the semiconductor integrated circuit according to Comparative Example of the embodiment of the present invention. The diffusion profile represents the impurity concentration measured along the line A-A in FIG. 1, which includes the source region 23, the second well region 22, the first well region 21, and the support layer 12. In the impurity concentration distribution of the semiconductor integrated circuit according to Comparative Example illustrated in FIG. 3, the first well region 21 and the second well region 22 of the first lateral element 101 are formed by a general ion implantation process and a general thermal diffusion process. In addition, the line A-A in FIG. 1 corresponds to the depth direction of the p-n-p multi-junction structure cutting the source region 23, but the impurity concentration distribution along the depth direction of the p-n-p multi-junction structure cutting the drain region 24 also becomes equal. In FIG. 3, the impurity concentration of the n-type dopants in the support layer 12, the impurity concentration of the p-type dopants in the first well region 21, the impurity concentration of the n-type dopants in the second well region 22, and the impurity concentration of the p-type dopants in the source region 23 are illustrated. The concentration of the p-type impurity atoms in the first well region 21 becomes a surface concentration d1, or the peak concentration d1 on the top surface side of the first well region 21.

The punch-through voltages in the n-p-n multi-junction structure which include the n-type support layer 12, the p-type first well region 21, and the n-type second well region 22 are defined by an integral charge amount Qp of an area indicated by slanted lines near the center of FIG. 3. The area in which the integral charge amount Qp is defined and indicated by slanted lines, is surrounded on three sides by (a) profile of the impurity concentration of the n-type dopants in the support layer 12, (b) profile of the impurity concentration of the p-type dopants in the first well region 21, and (c) profile of the impurity concentration of the n-type dopants in the second well region 22. The punch-through voltage in the n-p-n multi-junction structure is roughly proportional to the square of the integral charge amount Qp and becomes higher as the integral charge amount Qp is larger.

On the other hand, the punch-through voltages in the p-n-p multi-junction structure including the p$^+$-type source region 23, the n-type second well region 22 and the p-type first well region 21, and in the p-n-p multi-junction structure including the p$^+$-type drain region 24, the n-type second well region 22 and the p-type first well region 21 are defined by an integral charge amount Qn of an area indicated by slanted lines on the upper side of FIG. 3. The area in which the integral charge amount Qn is defined and indicated by slanted lines, is surrounded on three sides by (a) profile of the impurity concentration of the p-type dopants in the first well region 21, (b) profile of the impurity concentration of the n-type dopants in the second well region 22, and (c) profile of the impurity concentration of the p-type dopants in the source region 23. The punch-through voltage in the p-n-p multi-junction structure is roughly proportional to the square of the integral charge amount Qn and becomes higher as the integral charge amount Qn is larger.

When the integral charge amount Qn is increased in order to increase the punch-through voltage in the p-n-p multi-junction structure, it is necessary to increase the dose amount of ion implantation for forming the second well region 22 so as to form the second well region 22 with a high impurity concentration and deeply. When forming deeply the second well region 22 with the high impurity concentration, the integral area of the impurity concentration of the first well region 21 is compensated and canceled by the second well region 22 becomes large. When p-type and n-type impurities are compensated, the integral charge amount Qp is decreased, so that the punch-through voltage in the n-p-n multi-junction structure is decreased. That is, in the semiconductor integrated circuit according to Comparative Example, there is a trade-off relationship between the integral charge amount Qp and the integral charge amount Qn. In the trade-off relationship, if the integral charge amount Qp increases, the integral charge amount Qn must be decreased, and thus, the punch-through voltage in the p-n-p multi-junction structure shall be decreased, and vise versa. Therefore, it becomes difficult to secure a margin of breakdown-voltage characteristic against the required design-specification when the process varies.

Solution to Problem in Comparative Example

When an oxide film is formed on an impurity diffused layer provided on a semiconductor substrate made of Si by thermal oxidation, p-type impurities such as boron (B) and boron difluoride ($BF_2$) are absorbed and extracted into the oxide film, and thus, the concentration of the p-type impurities tends to be decreased in the vicinity of the interface between the oxide film and the semiconductor substrate. On the other hand, n-type impurities such as phosphorus (P) or arsenic (As) are segregated and are piled up, and thus, the concentration of the n-type impurities tends to be locally increased in the vicinity of the interface between the oxide film and the semiconductor substrate. In this regard, the inventors of the present invention actively utilized this phenomenon to find a method of selectively decreasing the p-type impurity concentration at the top surface of the first well region 21 by absorbing and extracting the p-type impurities at the top surface of the first well region 21 into the oxide film by adding a thermal oxidation process after formation of the first well region 21 of the first lateral element 101 of the semiconductor integrated circuit according to the embodiment.

Figure 4:
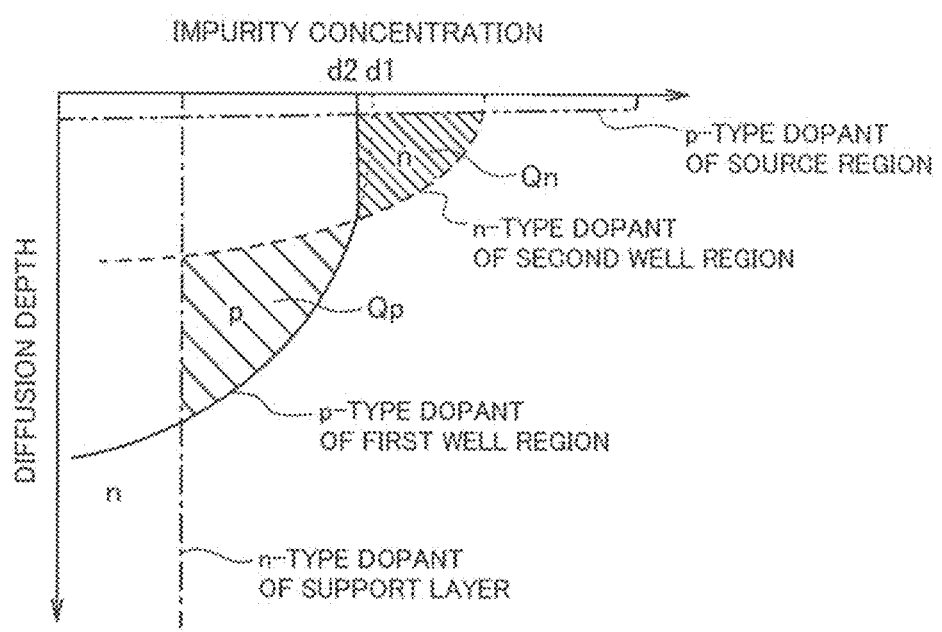
FIG. 4 is a graph showing an impurity concentration distribution in the depth direction from the surface of the semiconductor integrated circuit according to the embodiment of the present invention.

FIG. 4 illustrates an impurity concentration distribution (diffusion profile) in the depth direction in which the source region 23, the second well region 22, the first well region 21, and the support layer 12 are taken along the line A-A in FIG. 1 in a case where the thermal oxidation process is added after formation of the first well region 21 of the first lateral element 101. In FIG. 4, the impurity concentration of the n-type dopants in the support layer 12, the impurity concentration of the p-type dopants in the first well region 21, the impurity concentration of the n-type dopants in the second well region 22, and the impurity concentration of the p-type dopants in the source region 23 are illustrated. The impurity concentration of the p-type dopants in the first well region 21 becomes the surface concentration d2, or the peak concentration d2 at the top surface of the first well region 21. The surface concentration d1, or the peak concentration d1 at the top surface of the first well region 21 in the case of Comparative Example illustrated in FIG. 3 is also illustrated in FIG. 4.

As illustrated in FIG. 4, as the p-type dopants at the top surface of the first well region 21 are absorbed and extracted into the oxide film, the impurity concentration of the p-type dopants at the top surface, or near the interface with the oxide film of the first well region 21 is selectively decreased, and thus, the impurity profile at the top surface of the first well region 21 becomes flattened in the depth direction. Since the impurity profile is flattened in the depth direction, the surface concentration d2, or the peak concentration d2 at the top surface of the first well region 21 in FIG. 4 is lower than the surface concentration d1 in Comparative Example. As a result, it is possible to increase the integral charge amount Qn in the area indicated by slanted lines surrounded on the three sides by (a) the profile of the impurity concentration of the p-type dopants in the first well region 21, (b) the profile of the impurity concentration of the n-type dopants in the second well region 22, and (c) the profile of the impurity concentration of the p-type dopants in the source region 23. Therefore, the punch-through voltage in the p-n-p multi-junction structure can be improved.

On the other hand, since the impurity concentration of the p-type dopants on the bottom side of the first well region 21 is maintained, the value of the integral charge amount Qp of the area indicated by the slanted lines surrounded on three sides by (a) the profile of the impurity concentration of the n-type dopants in the support layer 12, (b) the profile of the impurity concentration of the p-type dopants in the first well region 21, and (c) the profile of the impurity concentration of the n-type dopants in the second well region 22 is maintained, and thus, the punch-through voltage in the n-p-n multi-junction structure is secured. Therefore, it is possible to improve the trade-off relationship of the punch-through voltages between the n-p-n multi-junction structure and the p-n-p multi-junction structure. Furthermore, even when the total charge amount of the second well region 22 is adjusted so that the surface concentration, or the peak concentration of the n-type dopants is decreased, the decrease of the integral charge amount Qn can be prevented, so that it is possible to lower a gate threshold voltage $V_{th}$ of the MOS-FET which is assigned as the first lateral element 101 while securing the punch-through voltage in the p-n-p multi-junction structure. Furthermore, since the impurity profile at the top surface of the first well region 21 is flattened in the depth direction, even when the impurity concentration of the n-type impurities varies, the variation of the integral charge amount Qn can be suppressed.

<Method of Manufacturing Semiconductor Integrated Circuit>

Next, an example of a method of manufacturing the semiconductor integrated circuit according to the embodiment of the present invention will be described with reference to FIG. 1 and FIGS. 5A to 16. Hereinafter, the first lateral element 101 of the circuit portion 100 illustrated in FIG. 1 will be mainly described. The lines A-A in FIGS. 5A, 6A, 7A, 11A, and 12A correspond to the position of the line A-A illustrated in FIG. 1. In addition, the method of manufacturing the semiconductor integrated circuit described below is an example, and the semiconductor integrated circuit according to the embodiment of the present invention can be manufactured by various other methods.

First, a semiconductor substrate—Si wafer—made of $n^+$-type silicon (Si) is prepared as a bottom contact layer 11, and an $n^-$-type support layer 12 is epitaxially grown on the bottom contact layer 11 to form a double-layer structured semiconductor base body (11, 12) (refer to FIG. 1). However, the support layer 12 may be made of $n^-$-type semiconductor substrate—Si wafer—. Then, the semiconductor base body (11, 12) may include the support layer 12 and the bottom contact layer 11 made of an $n^+$-type diffused layer at a bottom surface of to be the support layer 12, the bottom contact layer 11 is formed by ion implantation or thermal diffusion. In a case that the support layer 12 is made of a semiconductor substrate, if the thickness of the semiconductor substrate becomes a problem, after reinforcing the structure by attaching an $n^+$-type Si wafer to the bottom contact layer 11 through a direct bonding architecture or the like, the thickness of the semiconductor substrate may be adjusted to a required thickness of the support layer 12.

Figure 5B:
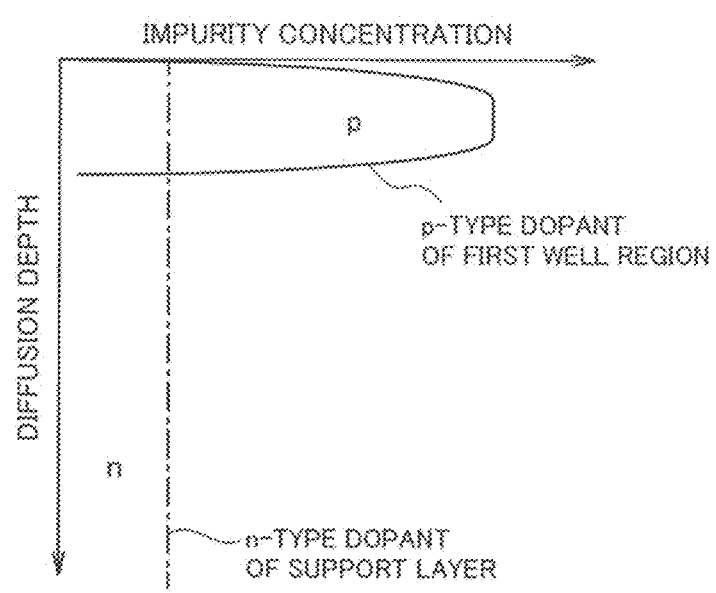
FIG. 5B is a graph showing an impurity concentration distribution corresponding to FIG. 5A.

Next, a photoresist 31 is coated on the support layer 12, and as illustrated in FIG. 5A, the photoresist 31 is delineated by photolithography technique. By using the delineated photoresist 31 as a mask for ion implantation, p-type impurity ions such as boron (B) ions are selectively implanted into the upper portion of the support layer 12. Next, the photoresist 31 used as a mask for ion implantation is removed. Next, although not illustrated, p-type impurity ions are selectively implanted into the base region (body region) in the portion corresponding to the vertical element 201 illustrated in FIG. 1 by the same photolithography technique. In addition, an opening for forming the well region 13 which is to be a base region (body region) may be cut in the photoresist 31 used as an ion-implantation mask, and at the same time, ion implantation may be performed. The ion implantation into the base region (body region) may be performed continuously or simultaneously as described above or may be performed after the trench formation process described later. After that, the impurity ions are activated by annealing. FIG. 5B illustrates an impurity profile of the portion corresponding to the support layer 12 in the depth direction along the line A-A illustrated in FIG. 5A in the initial state of the annealing.

Figure 6A:
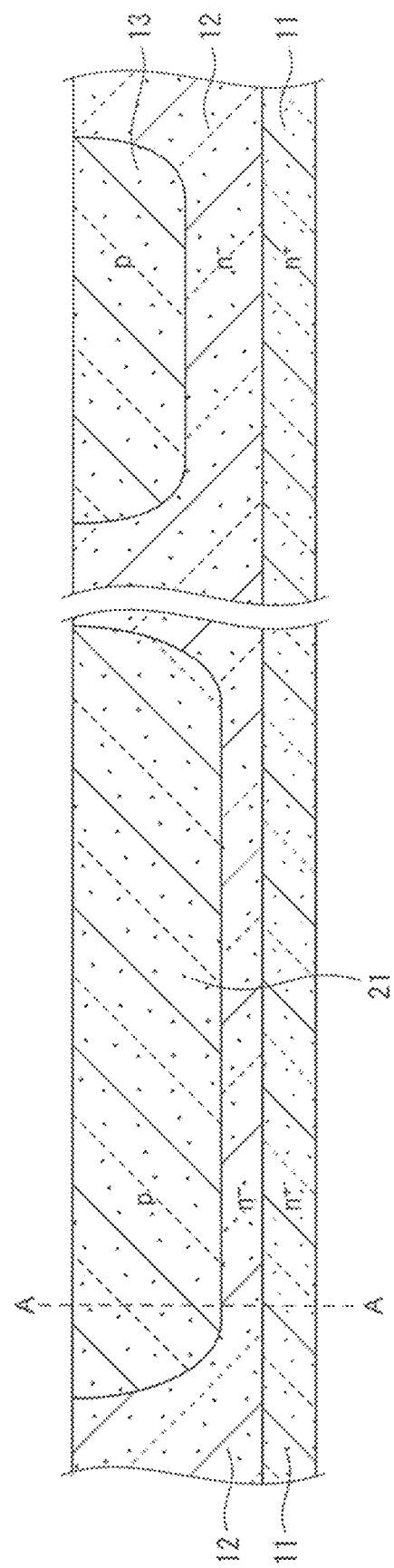
FIG. 6A is a process cross-sectional view continued from FIG. 5A illustrating the example of the method of manufacturing the semiconductor integrated circuit according to the embodiment of the present invention.
Figure 6B:
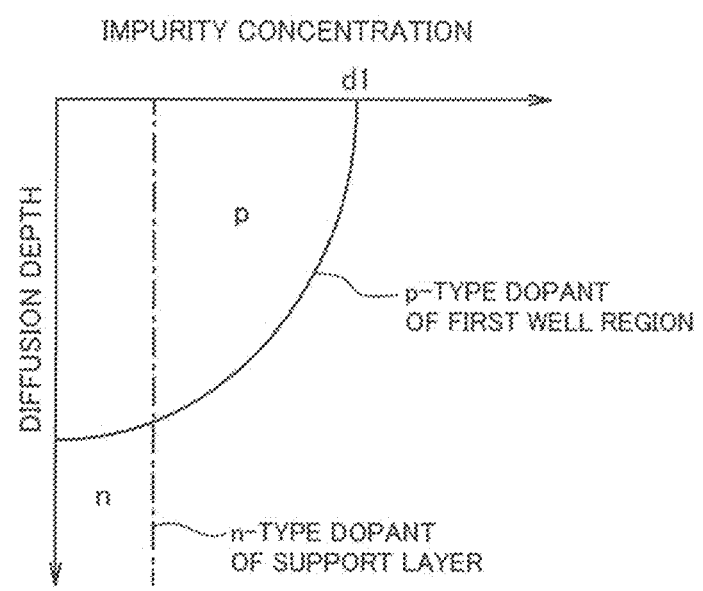
FIG. 6B is a graph showing an impurity concentration distribution corresponding to FIG. 6A.

After that, the annealing is further continued, and the p-type impurities are thermally diffused down to a desired depth as illustrated in FIG. 6A. In a case where ion implantation into the base region (body region) is performed, similarly, the well region 13 which is to be the base region (body region) is formed down to a desired depth also in the portion corresponding to the vertical element 201 illustrated in FIG. 1. In FIG. 6A, an example where ion implantations in different processes with different conditions are performed for the well region 21 and the well region 13 is illustrated. FIG. 6B illustrates an impurity profile of the portion of the support layer 12 in the depth direction along the line A-A illustrated in FIG. 6A. As illustrated in FIG. 6B, the surface concentration in the impurity profile of the p-type impurities is d1.

Figure 7A:
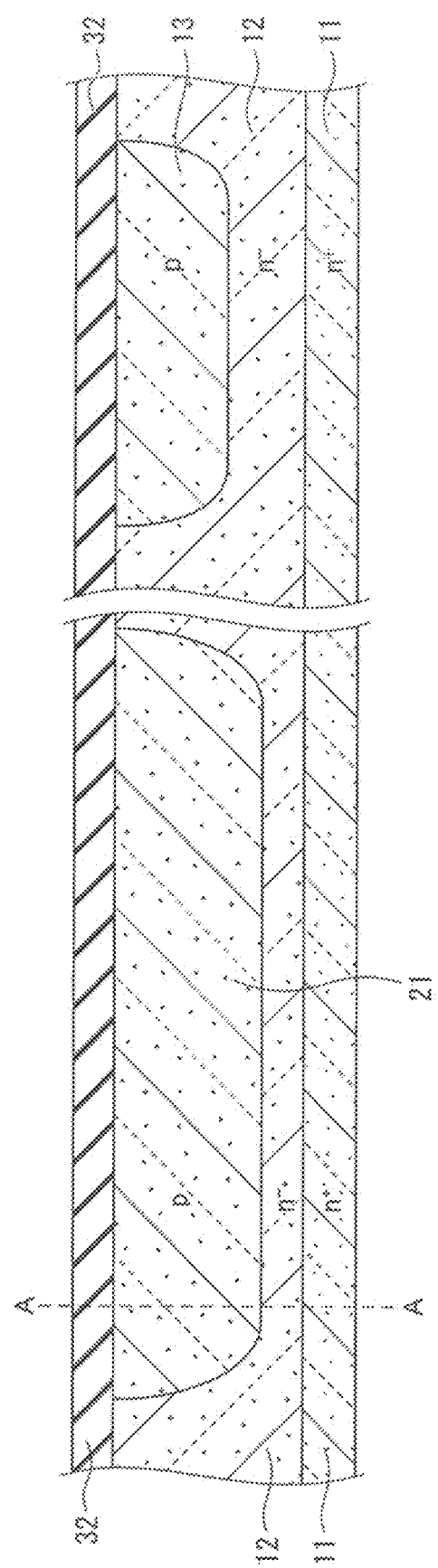
FIG. 7A is a process cross-sectional view continued from FIG. 6A illustrating the example of the method of manufacturing the semiconductor integrated circuit according to the embodiment of the present invention.

After that, as illustrated in FIG. 7A, an oxide film 32 made of an $SiO_2$ film is formed on the first well region 21 with a thickness of about 300 nm to 600 nm by a thermal oxidation method at, for example, about 900° C. to 1100° C. When the thickness of the oxide film 32 is about 300 nm or more, steam oxidation is preferable as thermal oxidation from the viewpoint of oxidation rate. However, for example, dry oxidation performed by introducing oxygen gas, pyro oxidation performed by burning oxygen gas and hydrogen gas, or the like may be used.

Figure 7B:
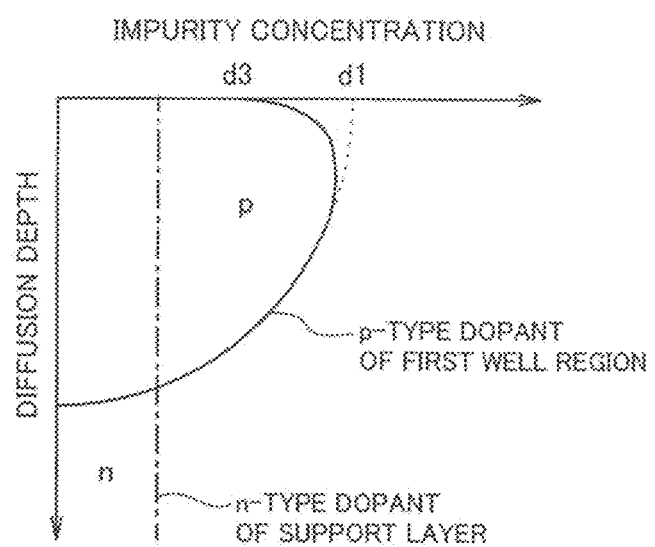
FIG. 7B is a graph showing an impurity concentration distribution corresponding to FIG. 7A.

FIG. 7B illustrates an impurity profile of the portion of the support layer 12 in the depth direction along the line A-A illustrated in FIG. 7A. As illustrated in FIG. 7B, the p-type impurities are absorbed and extracted by the oxide film 32, and thus, the surface concentration in the vicinity of the top surface of the first well region 21 is decreased from d1 to d3. With the change in the impurity profile in which the surface concentration is decreased from d1 to d3, the impurity profile of the first well region 21 becomes an impurity profile that is convex to the right in FIG. 7B. The impurity profile of the first well region 21 in the vicinity of the top surface at a position slightly separated from the top surface located at the peak of the impurity profile convex to the right in FIG. 7B is flattened in the depth direction. The amount of the p-type impurity absorbed and extracted by the oxide film 32 can be adjusted by the thickness of the oxide film 32, the temperature of the thermal oxidation process, or the like. For example, as the thickness of the oxide film 32 is increased, the amount of p-type impurity absorbed and extracted by the oxide film 32 is increased. In addition, as the temperature of the thermal oxidation process is increased, the amount of the p-type impurity absorbed and extracted by the oxide film 32 is increased.

Figure 8:
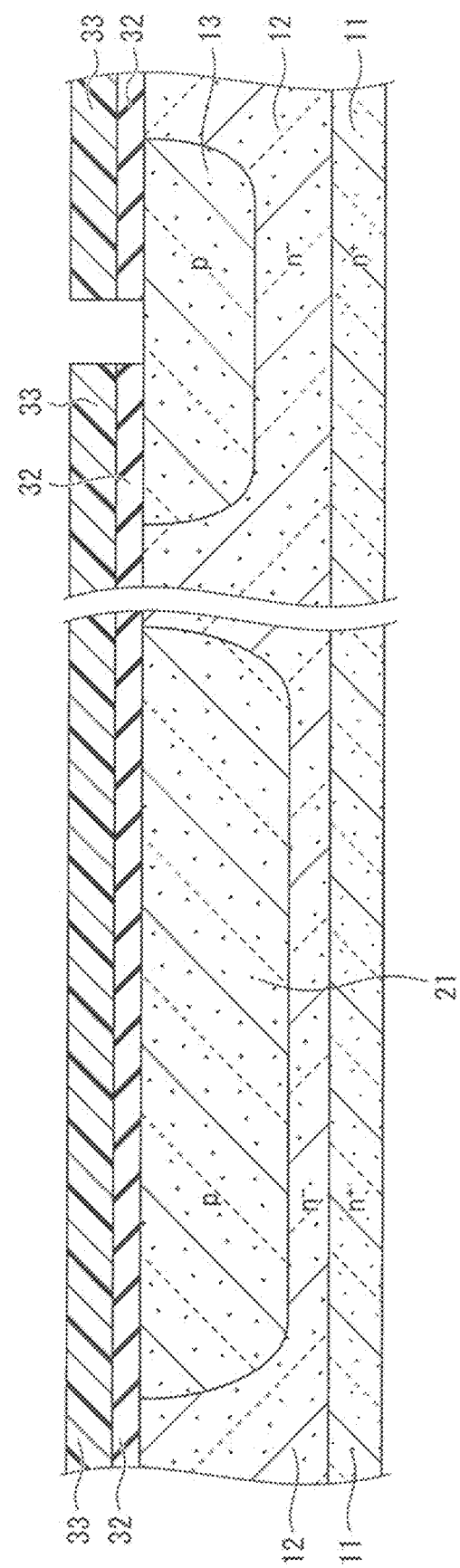
FIG. 8 is a process cross-sectional view continued from FIG. 7A illustrating the example of the method of manufacturing the semiconductor integrated circuit according to the embodiment of the present invention.

Next, a photoresist 33 is coated on the oxide film 32, and the photoresist 33 is delineated by photolithography technique. By using the delineated photoresist 33 as an etching mask, the oxide film 32 is delineated by dry etching such as reactive ion etching (RIE) as illustrated in FIG. 8. As a result, the top surface of the top main-electrode region (source region) 14 in an area corresponding to the vertical element 201 illustrated in FIG. 1 is exposed. After that, the photoresist 33 used as an etching mask is removed.

Next, by the oxide film 32 as an etching mask, as illustrated in FIG. 9, the trench 16 is selectively dug in an upper portion of the semiconductor base body (11, 12) down to a depth penetrating the well region 13 by dry etching such as RIE or the like. After that, the oxide film 32 used as an etching mask is removed as illustrated in FIG. 10. As illustrated in FIG. 9, since the oxide film 32 can be used as an etching mask for the trench 16, the thermal oxidation process illustrated in FIG. 7A is not an independent process but is incorporated into a process of forming an etching mask. That is, the thermal oxidation process illustrated in FIG. 7A does not increase the number of processes.

Figure 11A:
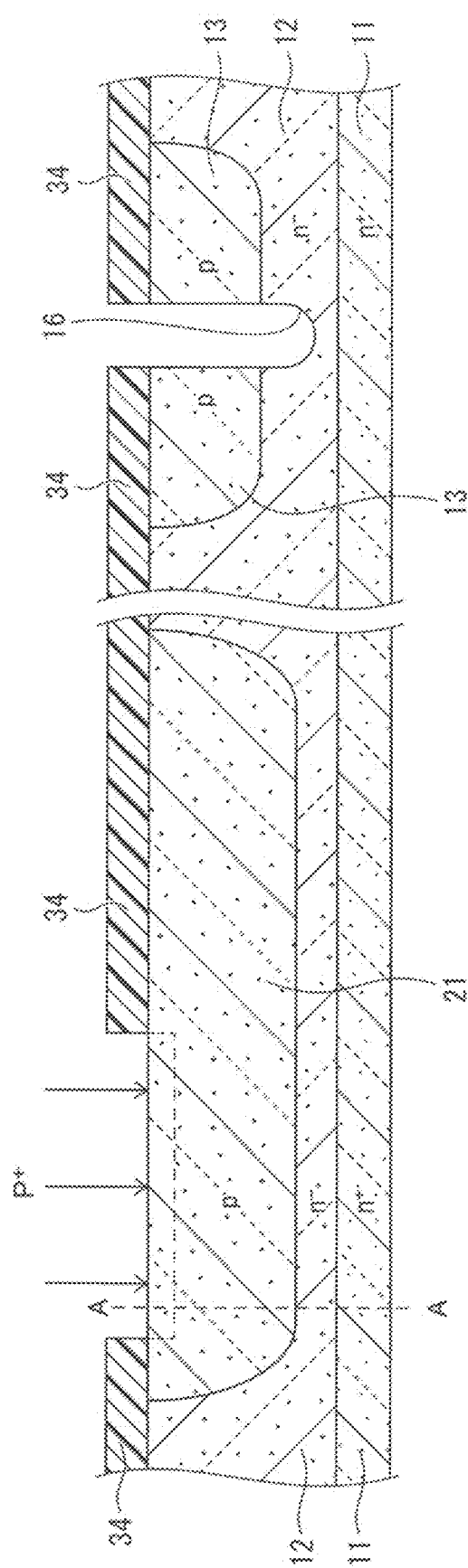
FIG. 11A is a process cross-sectional view continued from FIG. 10 illustrating the example of the method of manufacturing the semiconductor integrated circuit according to the embodiment of the present invention.
Figure 11B:
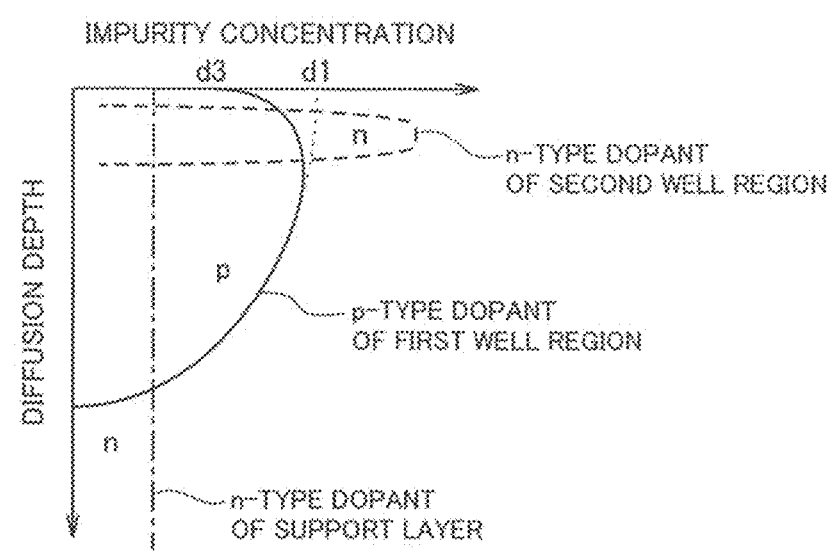
FIG. 11B is a graph showing an impurity concentration distribution corresponding to FIG. 11A.

By using the delineated photoresist 34 as a mask for ion implantation, as illustrated in FIG. 11A, n-type impurity ions such as phosphorus (P) ions are selectively implanted into the upper portion of the p-type first well region 21. Then, the photoresist 34 used as a mask for ion implantation is removed. And after removing the ion-implantation mask, impurity ions are activated by annealing. FIG. 11B illustrates an impurity profile of the support layer 12 in the depth direction along the line A-A illustrated in FIG. 11A in the initial state of the annealing. After that, the annealing is further continued, and the n-type impurities are thermally diffused down to a desired depth inside the first well region 21 to selectively form the n-type second well region 22 as illustrated in FIG. 12A.

Figure 12A:
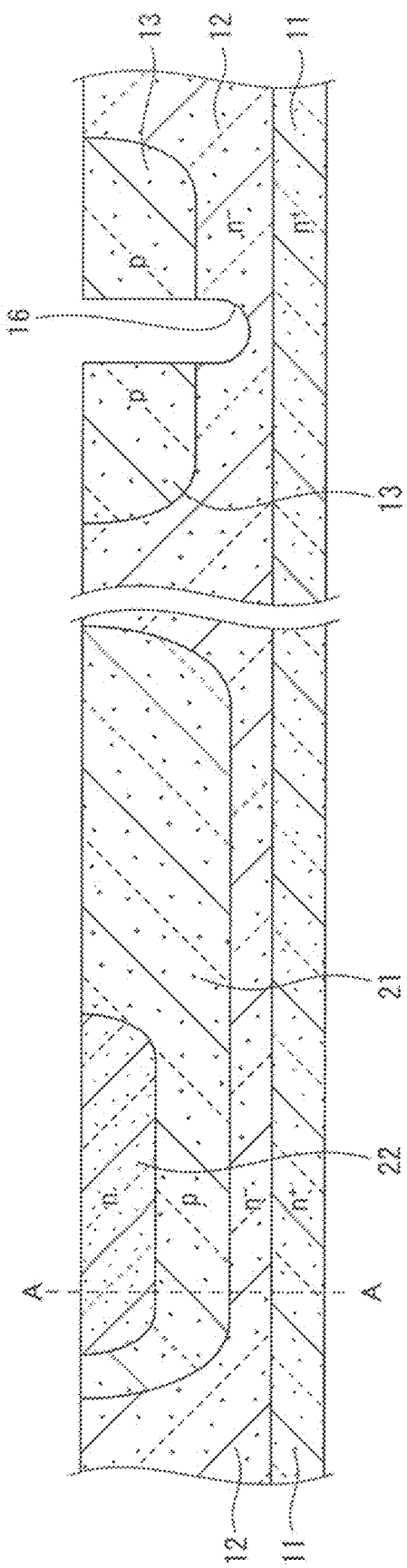
FIG. 12A is a process cross-sectional view continued from FIG. 11A illustrating the example of the method of manufacturing the semiconductor integrated circuit according to the embodiment of the present invention.
Figure 12B:
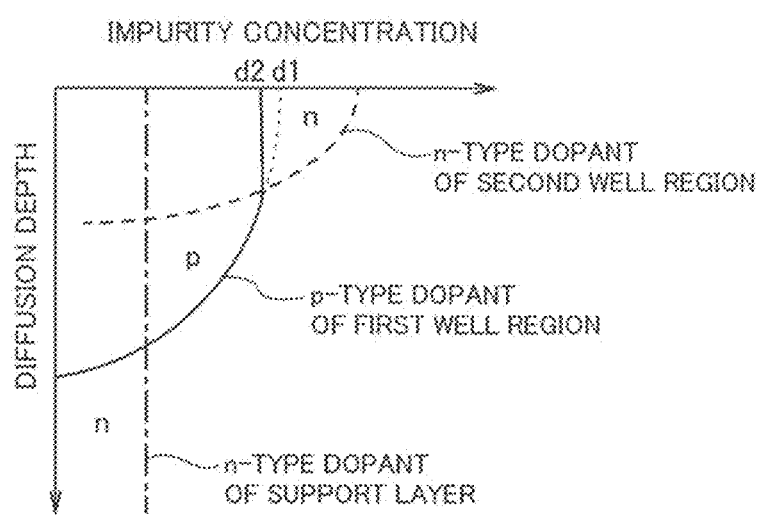
FIG. 12B is a graph showing an impurity concentration distribution corresponding to FIG. 12A.

FIG. 12B illustrates an impurity profile of the portion of the support layer 12 in the depth direction along the line A-A illustrated in FIG. 12A. As illustrated in FIG. 12B, the n-type implanted dopants are thermally diffused in the depth direction from the top surface of the support layer 12. On the other hand, the p-type dopants in the first well region 21 are thermally diffused to the upper portion of the support layer 12 in the depth direction, and thus, the impurity profile of the p-type dopants in the first well region 21 is made uniform. In FIG. 7B, with the change in the impurity profile, the surface concentration in the vicinity of the top surface of the first well region 21 has been decreased from d3 to d1, and therefore, the impurity profile of the first well region 21 was convex to the right in FIG. 7B. On the other hand, in FIG. 12B, the impurity profile of the p-type dopants at the top surface of the first well region 21 is made uniform and flattened in the depth direction.

Figure 13:
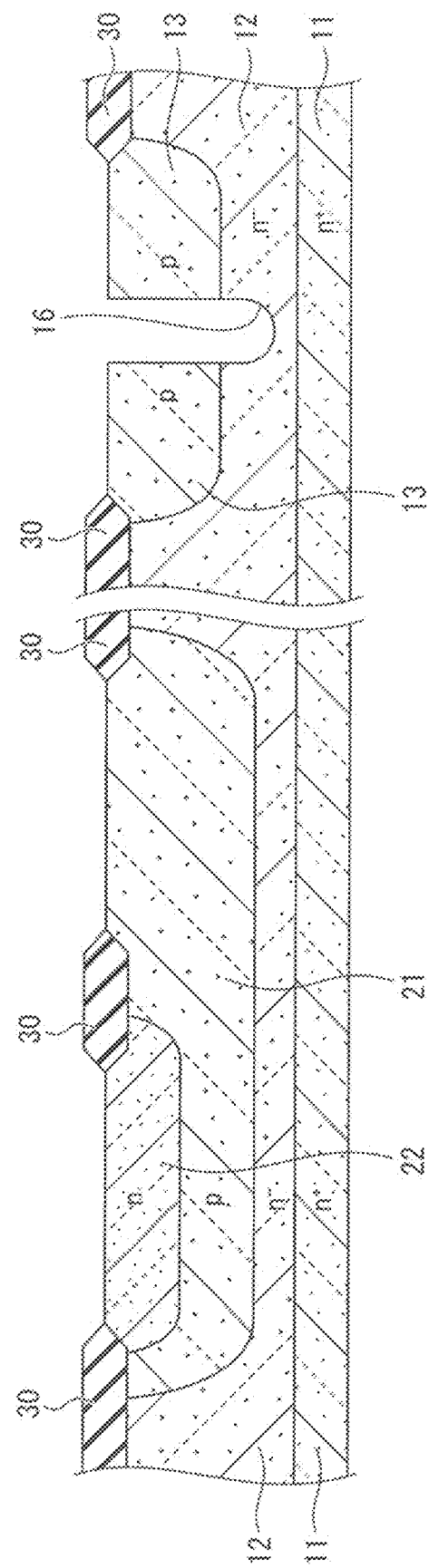
FIG. 13 is a process cross-sectional view continued from FIG. 12A illustrating the example of the method of manufacturing the semiconductor integrated circuit according to the embodiment of the present invention.

Next, a field oxide film 30, or a local oxidation of silicon (LOCOS) film 30 is selectively formed on the support layer 12 by LOCOS scheme. In the area of the first lateral element 101 in the circuit portion 100, as illustrated in FIG. 13, the top surface of the second well region 22 is exposed between the windows surrounded by the field oxide film 30. Next, by a thermal oxidation method, a gate insulating film 25 is formed on the second well region 22 and the first well region 21 exposed between the field oxide films 30, and a gate insulating film 17 is formed on the well region 13 and the inner wall of the trench 16. In addition, during the formation of the gate insulating film 25, absorption and extraction of p-type impurities occur directly under the gate insulating film 25, but since the gate insulating film 25 is thinly formed in a short time, the influence of the absorption and extraction is small.

Figure 14:
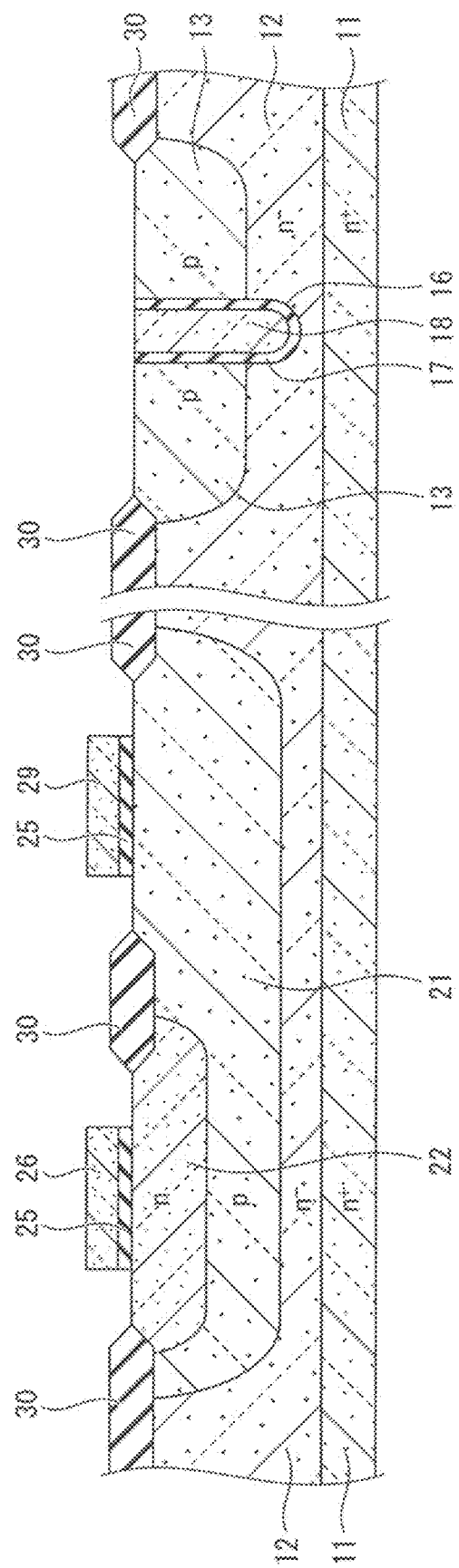
FIG. 14 is a process cross-sectional view continued from FIG. 13 illustrating the example of the method of manufacturing the semiconductor integrated circuit according to the embodiment of the present invention.

Next, a polysilicon layer is deposited on the field oxide film 30, on the gate insulating film 25, on the gate insulating film 17, and in the trench 16 by a chemical vapor deposition (CVD) method or the like. A photoresist is coated on the polysilicon layer, and the photoresist is delineated by photolithography technique. By using the delineated photoresist as an etching mask, the polysilicon layer, the gate insulating film 25, and the gate insulating film 17 are delineated by dry etching such as RIE or the like. After that, the photoresist used as the etching mask is removed. As a result, as illustrated in FIG. 14, a gate electrode 26, a gate electrode 29 and a gate electrode 18 made of a polysilicon layer are formed.

Figure 15:
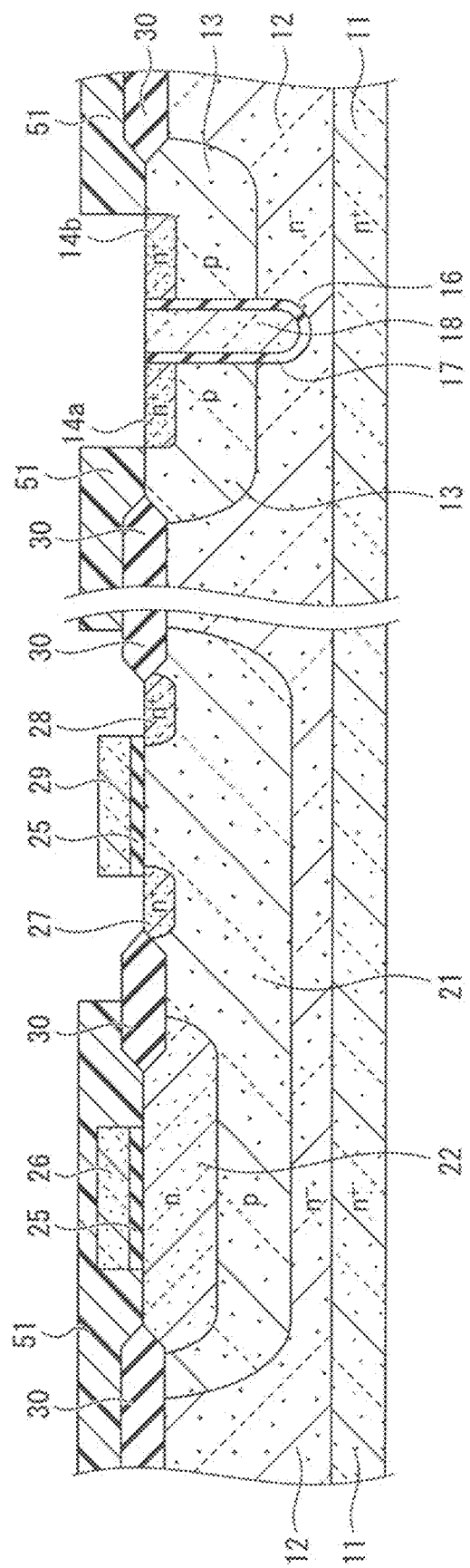
FIG. 15 is a process cross-sectional view continued from FIG. 14 illustrating the example of the method of manufacturing the semiconductor integrated circuit according to the embodiment of the present invention.

Next, as illustrated in FIG. 15, an ion-implantation mask 51 having openings on the well region 13 of the vertical element 201 and on the second lateral element 102 region is formed by photolithography technique. Then, through the ion-implantation mask 51, n-type impurity ions such as arsenic (As) ions are selectively implanted into the upper portion of the well region 13 and the upper portion of the second well region 22.

Figure 16:
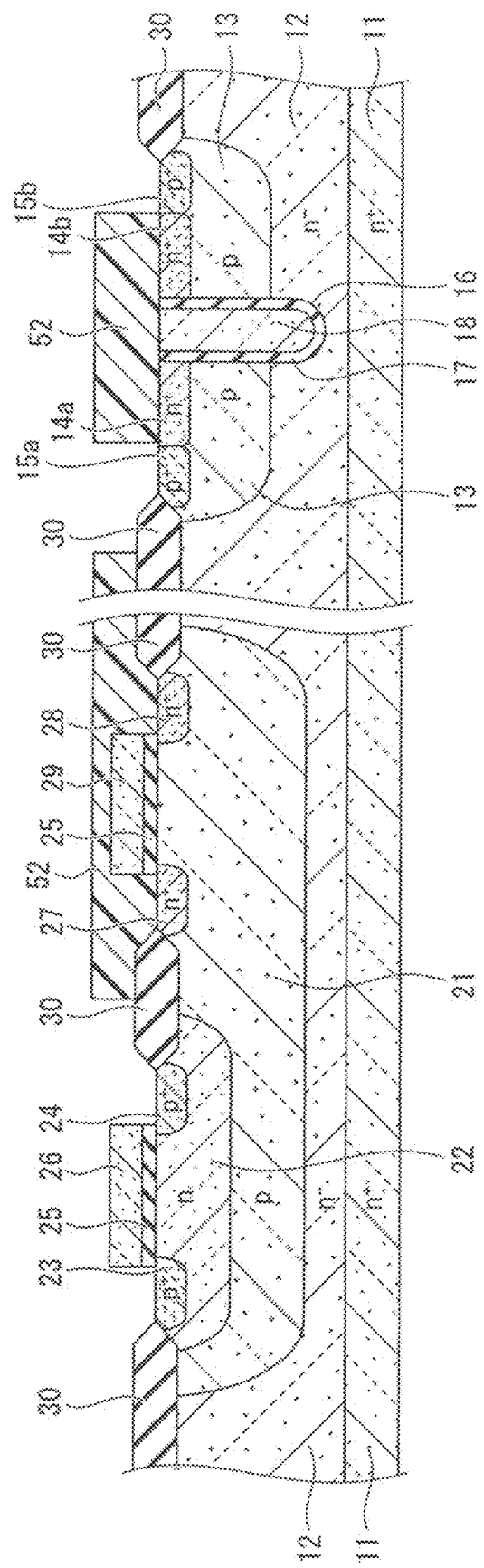
FIG. 16 is a process cross-sectional view continued from FIG. 15 illustrating the example of the method of manufacturing the semiconductor integrated circuit according to the embodiment of the present invention.

Next, as illustrated in FIG. 16, after the ion-implantation mask 51 is removed, an ion-implantation mask 52 having openings on the well region 13 and on the first lateral element 101 region is formed by newly using photolithography technique. Then, p-type impurity ions such as boron (B) ions are selectively implanted into the upper portion of the well region 13 and the upper portion of the first well region 21. After the ion-implantation mask 52 is removed, the source regions 14a and 14b and the base contact regions 15a and 15b of the vertical element 201 are formed by annealing. In addition, the first main-electrode region (source region) 23 and the second main-electrode region (drain region) 24 of the first lateral element are formed, and the third main-electrode region (source region) 27 and the fourth main-electrode region (drain region) 28 of the second lateral element are formed. In addition, herein, although the source regions 14a and 14b and the base contact regions 15a and 15b are formed after formation of the trench 16 and the burying with the polysilicon layer, the trench 16 may be formed after formation of the source regions 14a and 14b and the base contact regions 15a and 15b. The base contact regions 15a and 15b and the source region 23 and the drain region 24 may be separately formed. In addition, the source regions 14a and 14b and the source region 27 and the drain region 28 may be separately formed.

After the source region 23 and the drain region 24 are formed, an interlayer insulating film 19 is formed, and after that, although not illustrated, a metallic film of Al or the like is deposited by a sputtering method, an evaporation method, or the like. A photoresist is coated on the metallic film, and the photoresist is delineated by photolithography technique. By using the delineated photoresist as an etching mask, the metallic film is delineated by dry etching such as RIE or the like. As a result, a gate electrode, a source electrode interconnection, and a drain electrode interconnection are formed. In addition, a gate electrode, a source electrode interconnection, and a drain electrode interconnection may be formed in a salicide process using silicide of a refractory metal such as W, Mo, or Ti.

According to the method of manufacturing the semiconductor integrated circuit pertaining to the embodiment, as illustrated in FIG. 6A, after formation of the first well region 21, as illustrated in FIG. 7A, a thermal oxidation process is added or incorporated. As a result, as illustrated in FIG. 7B, an impurity profile in which the impurity concentration in the vicinity of the top surface of the first well region 21 is decreased can be realized while maintaining the value of the impurity concentration of the p-type impurities at the bottom of the first well region 21. For this reason, while maintaining the integral charge amount Qp defined by the profile on the bottom side of the first well region 21 or the like to be equal to that of the process in the related art, the integral charge amount Qn defined by the profile at the top surface of the first well region 21 or the like can be increased. Therefore, the trade-off of the punch-through voltages between the n-p-n multi-junction structure and the p-n-p multi-junction structure is improved, and the margin of breakdown-voltage characteristic against process variation can be easily secured in comparison with the related art.

In addition, as illustrated in FIG. 7A, the thermal oxidation process for absorption and extraction of the p-type impurities is performed together with the processes the output stage portion 200 side such as the etching mask formation process during the formation of the trench of the vertical element 201 illustrated in FIG. 1, so that it is possible to suppress an increase in the number of processes. Incidentally, although the number of processes is increased, the thermal oxidation process for absorption and extraction of the p-type impurities may be performed independently without being used together with the processes on the output stage portion 200 side. In this case, the oxide film formed in the thermal oxidation process for absorption and extraction of the p-type impurities may be immediately removed after the thermal oxidation process.

Modified Example

Figure 17A:
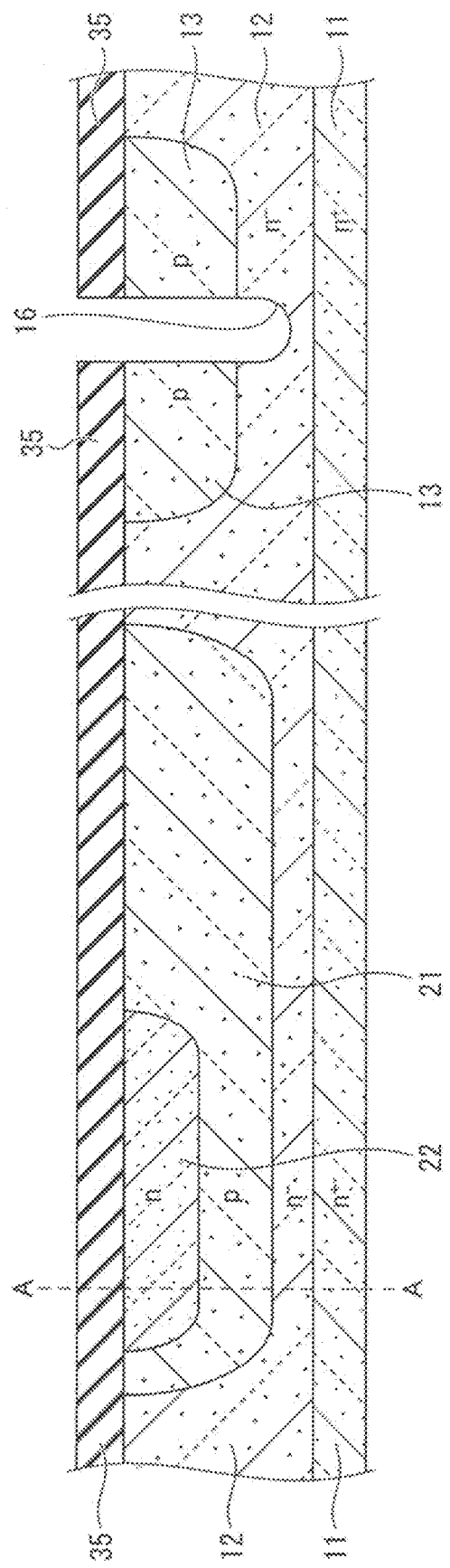
FIG. 17A is a process cross-sectional view illustrating an example of a method of manufacturing a semiconductor integrated circuit according to Modified Example of the embodiment of the present invention.

In the method of manufacturing a semiconductor integrated circuit according to the embodiment of the present invention, as illustrated in FIG. 6A, exemplified is the case of performing the thermal oxidation process after formation of the first well region 21 and before formation of the second well region 22. In contrast, absorption and extraction of the p-type impurities may be performed by forming an oxide film 35 by thermal oxidation as illustrated in FIG. 17A after formation of the second well region 22 as illustrated in FIG. 12A. In this case, the absorption and extraction of the p-type impurities may not be performed by forming an oxide film by thermal oxidation after formation of the first well region 21 and before the formation of the second well region 22.

Figure 17B:
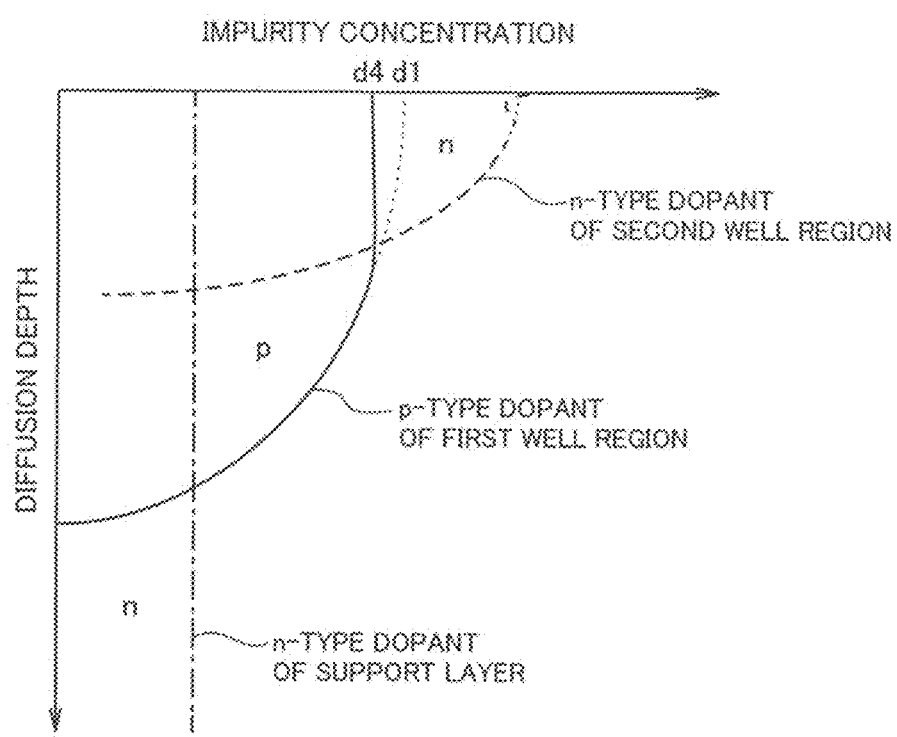
FIG. 17B is a graph showing an impurity concentration distribution corresponding to FIG. 17A.

FIG. 17B illustrates an impurity profile of the support layer 12 in the depth direction along the line A-A illustrated in FIG. 17A. As illustrated in FIG. 17B, the p-type impurities are redistributed by being absorbed and extracted into the oxide film 35 by thermal oxidation, and thus, the impurity concentration of the p-type impurities in the vicinity of the interface with the oxide film 35 is decreased. In FIG. 17B, comparing with the surface concentration, or the peak concentration d4 of the p-type impurities after the thermal oxidation process, the surface concentration, or the peak concentration d1 of the p-type impurities before the thermal oxidation process is also shown. The surface concentration d4 of the p-type impurities after the thermal oxidation process is lower than the surface concentration d1 before the thermal oxidation process. On the other hand, the n-type impurities are redistributed by pile-up, and thus, the impurity concentration becomes high in the vicinity of the interface with the oxide film 35.

After that, the oxide film 35 illustrated in FIG. 17A is removed. Since the other procedures are the same as those of the method of manufacturing the semiconductor integrated circuit according to the embodiment, and thus, duplicate description will be omitted. In addition, in the case of forming the oxide film 35 after formation of the second well region 22 as illustrated in FIG. 17A, the process may be combined with the process of the oxidation process for forming the etching mask by the oxide film, during the sequence of processes for forming the trench of the vertical element 201 illustrated in FIG. 1.

According to the method of manufacturing the semiconductor integrated circuit according to the Modified Example of the embodiment, even in a case where the oxide film 35 is formed by thermal oxidation as illustrated in FIG. 17A after formation of the second well region 22 as illustrated in FIG. 12A, the impurity profile in which the impurity concentration in the vicinity of the top surface of the first well region 21 is decreased can be realized while maintaining the value of the impurity concentration of the p-type dopants at the bottom of the first well region 21, as illustrated in FIG. 17B. For this reason, while maintaining the integral charge amount Qp defined by the profile of the p-type dopants on the bottom side of the first well region 21 or the like to be equal to that of the process in related art, the integral charge amount Qn defined by the profile of the p-type dopants at the top surface of the first well region 21 or the like can be increased. Therefore, the trade-off of the punch-through voltages between the n-p-n multi-junction structure and the p-n-p multi-junction structure is improved, and thus, the margin of breakdown-voltage characteristic against process variation can be easily secured in comparison with the related art.

OTHER EMBODIMENTS

As described above, the invention has been described according to the embodiments, but it should not be understood that the description and drawings implementing a portion of this disclosure limit the invention. Various alternative embodiments of the present invention, examples, and operational techniques will be apparent to those skilled in the art from this disclosure.

For example, in the above embodiment, the n-channel vertical MOSFET 101 having the trench gate structure is exemplified as the power semiconductor element of the output stage portion 200, but the semiconductor integrated circuit according to the invention can also be applied to n-channel planar MOSFETs. Furthermore, the power semiconductor element of the output stage portion 200 may be a vertical MOSSIT or a planar MOSSIT or may be more generally a vertical MIS transistor or a planar MIS transistor. In addition, the power semiconductor element of the output stage portion 200 may be an IGBT or an SI thyristor. When such a power semiconductor element of the output stage portion 200 has a trench gate structure, an oxide film formed in a thermal oxidation process for decreasing the impurity concentration of the impurities at the interface can be used as a mask for trench formation, which is preferable.

In addition, in FIG. 1, the structure where the n$^-$-type support layer 12 is epitaxially grown on the bottom contact layer 11 made of the n$^+$-type semiconductor substrate has been exemplified as the semiconductor base body (11, 12), but the structure is not limited to the above illustrated semiconductor base body (11, 12). For example, instead of the bottom contact layer 11, an n$^+$-type buried layer epitaxially grown on a p-type support substrate, or a p-type semiconductor wafer, and an n$^-$-type support layer 12 may be epitaxially grown on the n$^+$-type buried layer, so that a semiconductor base body can have a three-layer structure. In the case of a semiconductor base body having the three-layer structure using an n$^+$-type buried epitaxial layer instead of the bottom contact layer 11, a sinker reaching the buried epitaxial layer from the top surface of the support layer 12 may be provided. That is, the sinker may be connected from the top surface of the support layer 12 to the n$^+$-type buried epitaxial layer assigned as the bottom main-electrode region (drain region). In this case, the bottom main-electrode interconnection shall be provided at the top surface of the support layer 12. In the case of using an n$^+$-type buried epitaxial layer instead of the bottom contact layer 11, the support substrate on the bottom surface side may be an insulator substrate so as to establish an SOI structure.

As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:

1. A method of manufacturing a semiconductor integrated circuit, comprising:
   preparing a support layer having a first conductivity type;
   forming, at a first location corresponding to a circuit portion of the semiconductor integrated circuit; a first well region having a second conductivity type in an upper portion of the support layer;
   forming, at a second location corresponding to an active area of an output stage portion of the semiconductor integrated circuit, a second well region having the second conductivity type in the upper portion of the support layer;
   after forming the first well region and the second well region, forming an oxide film on the first well region and the second well region by a thermal oxidation method, to decrease a concentration of impurities at a top surface of the first well region and at a top surface of the second well region, the impurities having the second conductivity type;
   after forming the oxide film on the first well region and the second well region, digging a trench in the upper portion of the support layer to a depth penetrating the second well region;
   removing the oxide film;
   after removing the oxide film, forming a third well region having the first conductivity type in an upper portion of the first well region;
   after forming the third well region forming a first gate insulating film on the first well region and the third well region, and forming a second gate insulating film on the second well region and an inner wall of the trench;
   forming a main-electrode region having the second conductivity type in an upper portion of the third well region; and
   merging the circuit portion having a semiconductor element with the output stage portion.

2. A method of manufacturing a semiconductor integrated circuit, comprising:
   preparing a support layer having a first conductivity type;
   forming a first well region having a second conductivity type in an upper portion of the support layer;
   forming a second well region having the first conductivity type in an upper portion of the first well region;
   forming an oxide film on the second well region by a thermal oxidation method to decrease a concentration of impurities at the top surface of the second well region, the impurities having the second conductivity type;
   removing the oxide film;
   merging a semiconductor element having a main-electrode region having the second conductivity type in the second well region; and
   monolithically merging a vertical MIS transistor separated from the first well region,
   wherein after removing the oxide film, the method comprises:
   forming a first gate insulating film of the vertical MIS transistor with a thickness thinner than a thickness of the oxide film; and
   forming a second gate insulating film on the second well region with a thickness thinner than the thickness of the oxide film.

3. The method of claim 1, wherein a power semiconductor element is monolithically merged with the output stage portion.

4. The method of claim 3, wherein the power semiconductor element is a vertical MIS transistor.

5. The method of claim 3, wherein the power semiconductor element has a trench gate structure.

6. The method of claim 5, wherein
digging the trench comprises forming an etching mask by delineating the oxide film, and digging the trench in the support layer by etching using the etching mask, and
after forming the second gate insulating film on the second well region and the inner wall of the trench, depositing a polysilicon layer in the trench to form a gate electrode.

7. The method of claim 2, wherein the vertical MIS transistor has a trench gate structure.

8. The method of claim 7, wherein an etching mask is formed by delineating the oxide film, and a trench of the vertical MIS transistor is cut in the support layer by etching using the etching mask.

9. The method of claim 1, wherein
a depth of the second well region with respect to the top surface of the first well region is shallower than a depth of the first well region with respect to the top surface of the first well region, and
a depth of the third well region with respect to the top surface of the first well region is shallower than a depth of the second well region with respect to the top surface of the first well region.

10. The method of claim 1, wherein a depth of the third well region with respect to the top surface of the first well region is shallower than a depth of the first well region with respect to the top surface of the first well region.

11. The method of claim 1, wherein the first conductivity type is an n type, and the second conductivity type is a p type.

12. The method of claim 1, wherein
the thermal oxidation method is performed at a temperature of 900 degrees Celsius to 1100 degree Celsius, and
the oxide film has a thickness of 300 nm to 600 nm.

13. The method of claim 2, wherein a depth of the second well region with respect to the top surface of the first well region is shallower than a depth of the first well region with respect to the top surface of the first well region.

14. The method of claim 2, wherein the first conductivity type is an n type, and the second conductivity type is a p type.

15. The method of claim 2, wherein
the thermal oxidation method is performed at a temperature of 900 degrees Celsius to 1100 degree Celsius, and
the oxide film has a thickness of 300 nm to 600 nm.

16. The method of claim 1, further comprising:
forming a first photoresist on the oxide film;
using the first photoresist and the oxide film as an etching mask to expose a part of the top surface of the second well region;
removing the first photoresist; and
after removing the first photoresist and before removing the oxide film, digging the trench.

17. The method of claim 16, further comprising:
after removing the oxide film and before forming the third well region, forming a second photoresist on the first well region and the second well region;
using the second photoresist as a mask for ion implantation in the upper portion of the first well region to form the third well region; and
removing the second photoresist.

18. The method of claim 17, further comprising:
forming a first lateral control-electrode structure, as part of the semiconductor element, on the third well region; and
forming a second lateral control-electrode structure, as part of another semiconductor element, on the first well region, adjacent to the first lateral control-electrode structure.

19. The method of claim 1, wherein
in forming the first well region, the first well region is formed so that the concentration of impurities in the first well region is highest at the top surface of the first well region, and
in decreasing the concentration of impurities at the top surface of the first well region and at the top surface of the second well region, the oxide film is formed so that the concentration of impurities in the first well region is highest at a depth position separated from the top surface of the first well region.

20. The method of claim 19, wherein an impurity profile at a top surface side of the first well region is flattened by forming the third well region in the upper portion of the first well region.

* * * * *

UNITED STATES PATENT AND TRADEMARK OFFICE
CERTIFICATE OF CORRECTION

PATENT NO.       : 11,164,797 B2
APPLICATION NO.  : 16/214844
DATED            : November 2, 2021
INVENTOR(S)      : Yoshiaki Toyoda Page 1 of 1

It is certified that error appears in the above-identified patent and that said Letters Patent is hereby corrected as shown below:

In the Claims

Column 18, Line 6:
In Claim 1, delete "circuit;" and insert --circuit,--, therefor.

Column 18, Line 30:
In Claim 1, delete "region" and insert --region,--, therefor.

Signed and Sealed this
Twenty-first Day of December, 2021

Drew Hirshfeld
*Performing the Functions and Duties of the
Under Secretary of Commerce for Intellectual Property and
Director of the United States Patent and Trademark Office*